United States Patent
Zhong et al.

(10) Patent No.: US 8,133,745 B2
(45) Date of Patent: Mar. 13, 2012

(54) METHOD OF MAGNETIC TUNNELING LAYER PROCESSES FOR SPIN-TRANSFER TORQUE MRAM

(75) Inventors: Tom Zhong, Saratoga, CA (US);
Rongfu Xiao, Fremont, CA (US);
Chyu-Jiuh Torng, Pleasanton, CA (US);
Adam Zhong, Milpitas, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 99 days.

(21) Appl. No.: 11/975,045

(22) Filed: Oct. 17, 2007

(65) Prior Publication Data
US 2009/0104718 A1 Apr. 23, 2009

(51) Int. Cl.
*H01L 21/00* (2006.01)

(52) U.S. Cl. ................ 438/3; 257/295; 257/E21.208

(58) Field of Classification Search ........ 438/3; 257/295, 257/E21.208; 365/158; 360/324.2
See application file for complete search history.

(56) References Cited

U.S. PATENT DOCUMENTS

| | | | |
|---|---|---|---|
| 6,984,529 B2 | 1/2006 | Stojakovic et al. | |
| 7,046,545 B2* | 5/2006 | Hosotani | 365/158 |
| 7,067,866 B2 | 6/2006 | Shi | |
| 2004/0262635 A1 | 12/2004 | Lee | |
| 2005/0078417 A1* | 4/2005 | Kishi et al. | 360/324.2 |
| 2005/0274998 A1* | 12/2005 | Fontana et al. | 257/295 |
| 2006/0263699 A1* | 11/2006 | Abatchev et al. | 430/5 |
| 2007/0015294 A1 | 1/2007 | Horng et al. | |
| 2007/0155027 A1* | 7/2007 | Ditizio | 438/3 |
| 2009/0078927 A1* | 3/2009 | Xiao et al. | 257/9 |

FOREIGN PATENT DOCUMENTS
WO PCT/US 08/11770 12/2008

OTHER PUBLICATIONS

Co-pending U.S. Patent HMG 06-042-051, U.S. Appl. No. 11/699,875, filed Jan. 30, 2007, "A Novel Magnetic Tunnel Junction (MTJ) to Reduce Spin Transfer Magnetization Switching Current", Assigned to the same assignee as the present invention.
"Current-driven excitation of magnetic multilayers", by J.C. Slonczewski, Jrnl. of Magnetism and Magnetic Materials 159(1996) L1-L17, Elsevier.
"Emission of spinwaves by a magnetic multilayer traversed by a current", by L. Berger, Physical Review B, vol. 54, No. 13, Oct. 1, 1996-I, The American Physical Society, pp. 9353-9358

(Continued)

*Primary Examiner* — Ha Tran T Nguyen
*Assistant Examiner* — Shaun Campbell
(74) *Attorney, Agent, or Firm* — Saile Ackerman LLC; Stephen B. Ackerman

(57) ABSTRACT

A method for forming a MTJ in a STT-MRAM is disclosed in which the easy-axis CD is determined independently of the hard-axis CD. One approach involves two photolithography steps and two etch steps to form a post in a hard mask which is transferred through a MTJ stack of layers by a third etch process. Optionally, the third etch may stop on the tunnel barrier or in the free layer. A second embodiment involves forming a first parallel line pattern on a hard mask layer and transferring the line pattern through the MTJ stack with a first etch step. A planar insulation layer is formed adjacent to the sidewalls in the line pattern and then a second parallel line pattern is formed which is transferred by a second etch through the MTJ stack to form a post pattern. Etch end point may be controlled independently for hard-axis and easy-axis dimensions.

24 Claims, 14 Drawing Sheets

OTHER PUBLICATIONS

"Spin transfer switching and spin polarization in magnetic tunnel junctions with MgO and AlO$_x$ barriers", by Zhitao Diao et al., Applied Phys. Lett. 87, 232502 (2005), pp. 1-3.

"230% room-temperature magnetoresesitance in CoFeB/MgO/CoFeB magnetic tunnel junctions", by Djayaprawira et al., Applied Phys. Lett. 86, 092502(2005), American Inst.of Physics, pp. 1-3.

"A Novel Nanvolatile Memory with Spin Torque Transfer Magnetization Switching: Spin-RAM", by Hosomi et al., IDEM paper by Sony, 4 pgs.

"Spin transfer switching current reduction in magnetic tunnel junction based dual spin fitter structures", by Yiming Huai et al., Applied Phys. Lett. 87(2005) 222510, American Inst. of Physics, pp. 1-3.

* cited by examiner

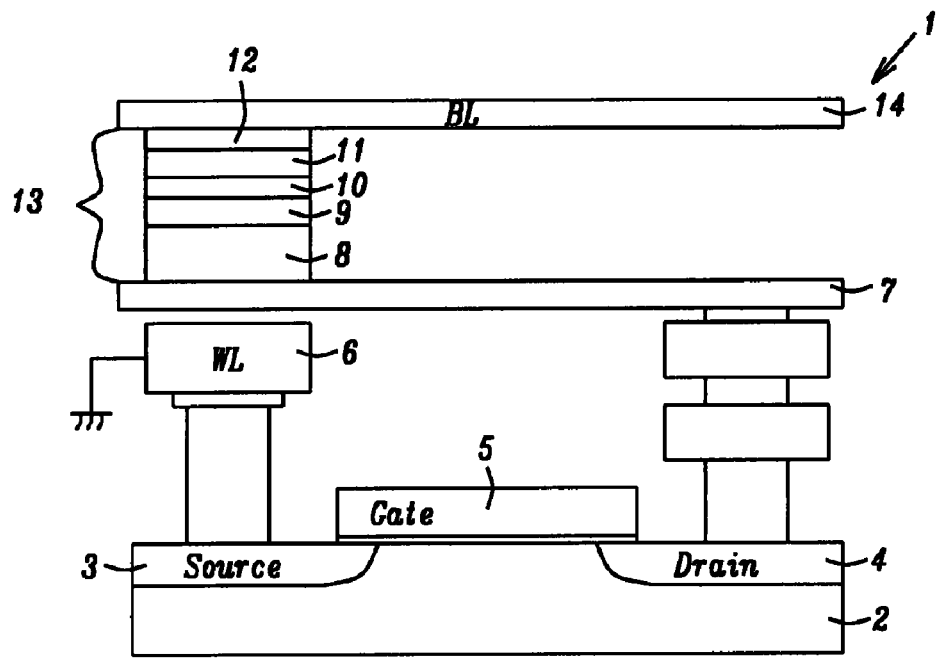
FIG. 1 – Prior Art
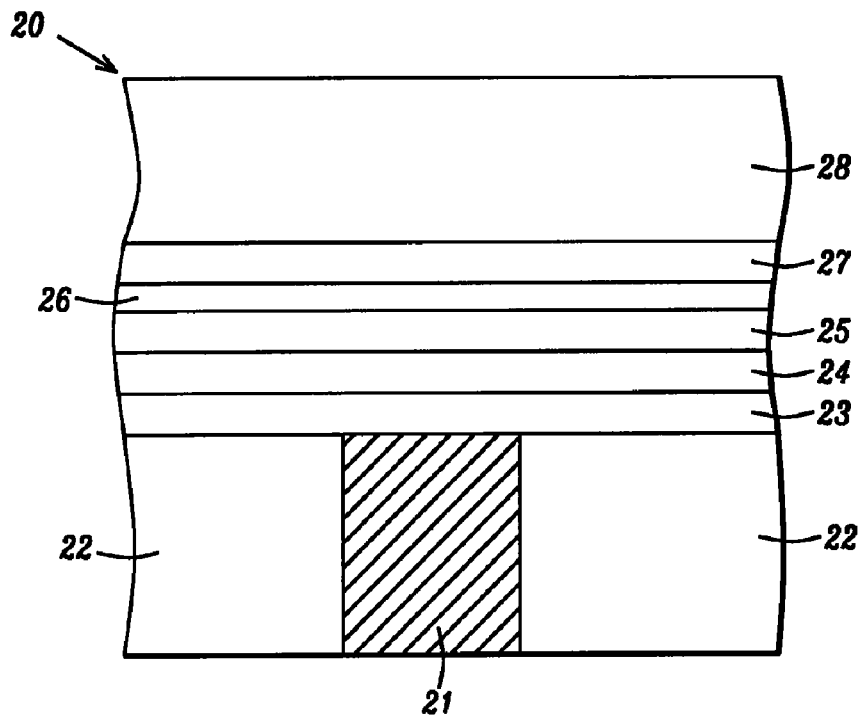
FIG. 2 – Prior Art

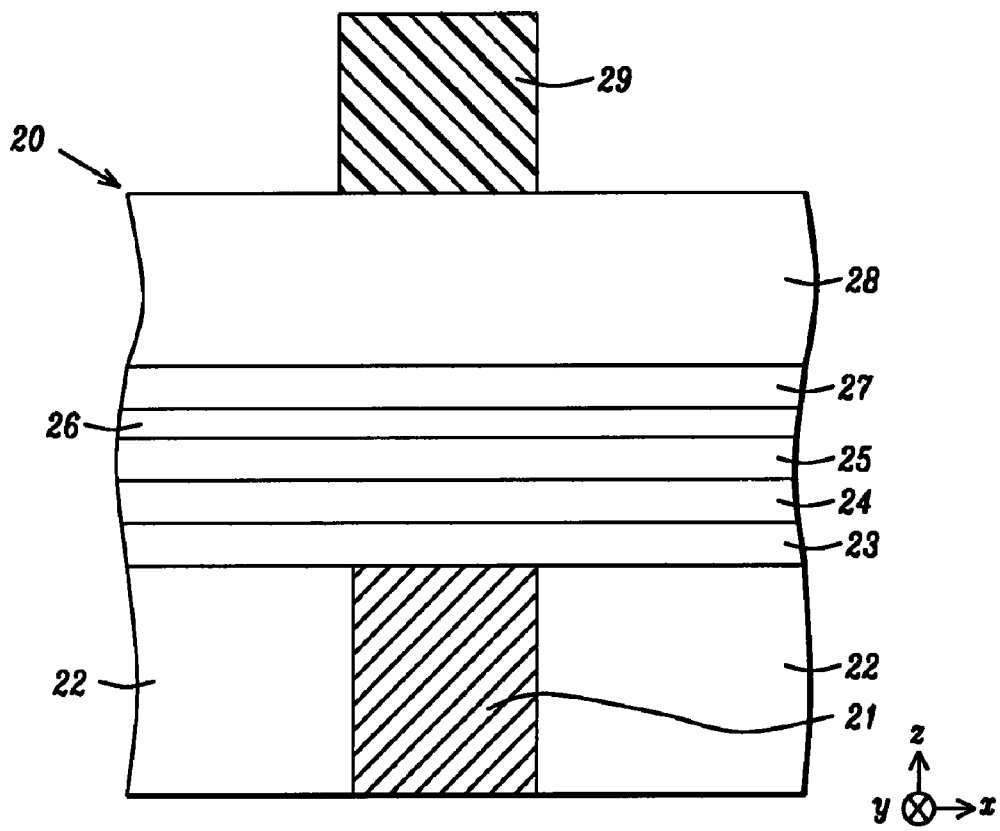
FIG. 3a – Prior Art
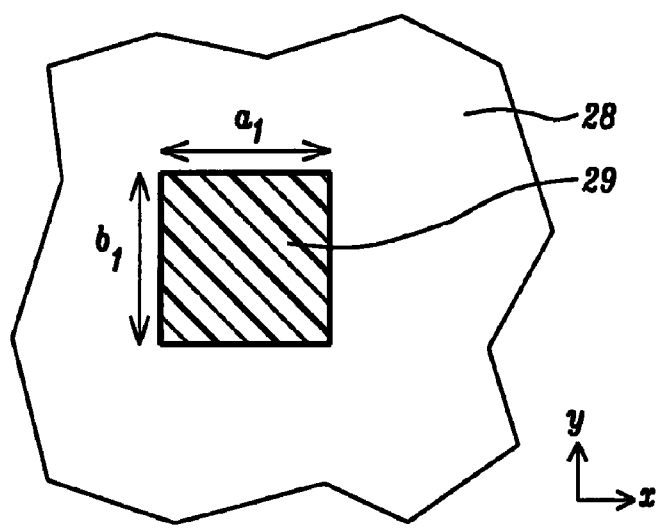
FIG. 3b – Prior Art

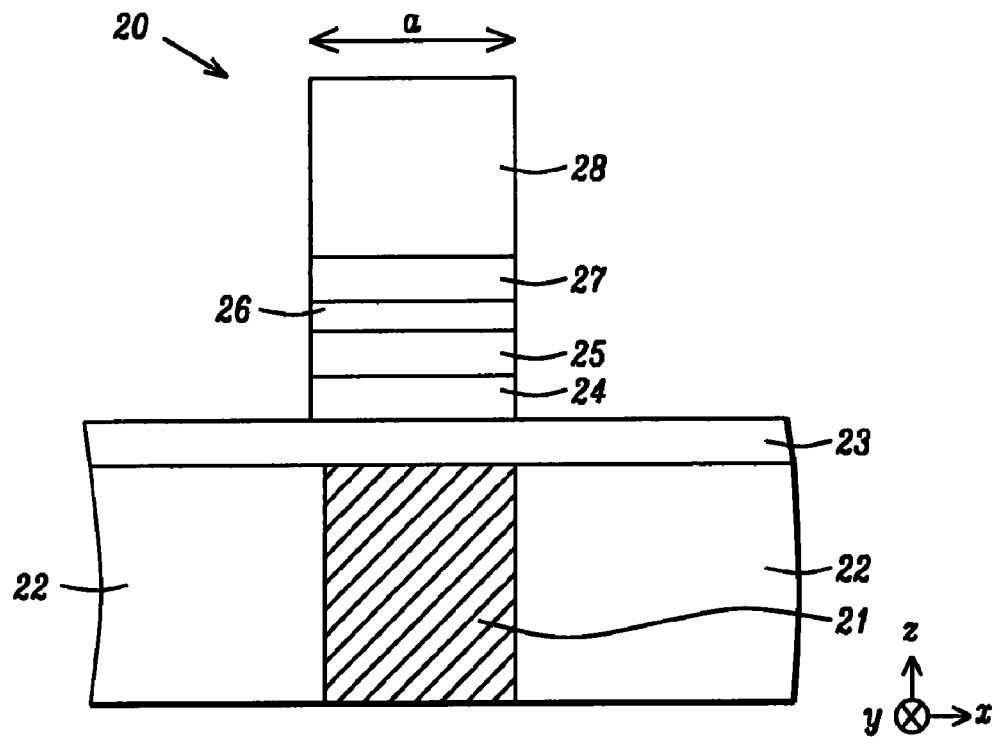
FIG. 4a - Prior Art
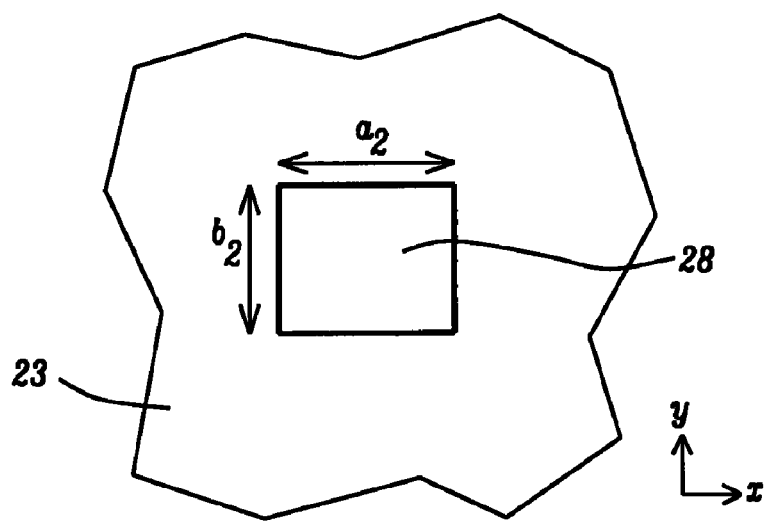
FIG. 4b - Prior Art

METHOD OF MAGNETIC TUNNELING LAYER PROCESSES FOR SPIN-TRANSFER TORQUE MRAM

RELATED PATENT APPLICATION

This application is related to the following: Ser. No. 11/699,875, filing date Jan. 30, 2007; assigned to a common assignee and herein incorporated by reference in its entirety.

FIELD OF THE INVENTION

The invention relates to a method of fabricating a magnetic tunneling junction (MTJ) element for improved critical dimension (CD) control along easy-axis and hard-axis directions and flexible etch end point which provides improved performance in spin-transfer torque MRAM (STT-MRAM) devices.

BACKGROUND OF THE INVENTION

Magnetoresistive Random Access Memory (MRAM), based on the integration of silicon based Complementary Silicon-Oxide Semiconductor (CMOS) with MTJ technology, is a technology that is highly competitive with existing semiconductor memories such as SRAM, DRAM, Flash, etc. MRAM is now a proven nonvolatile memory technology with many advantages over other commercialized memory types in terms of writing/read speed, power consumption, lifetime, etc. However, conventional MRAM has a fundamental limitation of scalability. STT-MRAM not only possesses the major benefits of conventional MRAM but also has tremendous potential for scalability. Unlike conventional MRAM that requires a separate word line in addition to a BIT line to switch the magnetization direction of a free layer in a MTJ, STT-MRAM relies only on a current passing through the MTJ to rotate the free layer magnetization direction. In order for STT-MRAM to switch a bit, however, the current density passing through the MTJ device should be larger than a critical switching current density (Jc). Since current density is inversely proportional to device physical size given a fixed amount of current, the switching efficiency increases as the CD size of the MTJ decreases. Thus, CD is normally quite small for a STT-MRAM and is typically less than 100 nm in size.

A MTJ element may be based on a tunneling magneto-resistance (TMR) effect wherein a stack of layers has a configuration in which two ferromagnetic layers are separated by a thin non-magnetic dielectric layer. In a MRAM device, the MTJ element is formed between a bottom electrode such as a first conductive line and a top electrode which is a second conductive line. A MTJ stack of layers that is subsequently patterned to form a MTJ element may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer. The AFM layer holds the magnetic moment of the pinned layer in a fixed direction. In a MRAM MTJ, the free layer is preferably made of NiFe because of its reproducible and reliable switching characteristics as demonstrated by a low switching field (Hc) and switching field uniformity ($\sigma$Hc). Alternatively, a MTJ stack may have a top spin valve configuration in which a free layer is formed on a seed layer followed by sequentially forming a tunnel barrier layer, a pinned layer, AFM layer, and a capping layer.

The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. In a read operation, when a sense current is passed from the top electrode to the bottom electrode in a direction perpendicular to the MTJ layers otherwise known as a current perpendicular to plane (CPP) configuration, a lower resistance is detected when the magnetization directions of the free and pinned layers are in a parallel state ("1" memory state) and a higher resistance is noted when they are in an anti-parallel state or "0" memory state.

During a write operation, information is written to the MRAM cell by changing the magnetic state in the free layer from a "1" to a "0" or from a "0" to a "1". In conventional MRAM, this process is accomplished by generating external magnetic fields as a result of applying bit line and word line currents in two crossing conductive lines, either above or below the MTJ element. Alternatively, in STT-MRAM, spin torque magnetization switching is used. Spin transfer (spin torque) magnetization switching has been described by J. Sloneczewski in "Current-driven excitation of magnetic multilayers", J. Magn. Materials V 159, L1-L7 (1996), and by L. Berger in "Emission of spin waves by a magnetic multiplayer traversed by a current" in Phys. Rev. Lett. B, Vol. 52, p. 9353. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-MRAM (also known as Spin-RAM) and a conventional MRAM is only in the write operation mechanism. The read mechanism is the same.

Referring to FIG. 1, a memory cell 1 of a STT-MRAM includes a MTJ 13, word line (WL) 6, bit line (BL) 14, bottom electrode 7, and a CMOS transistor having a source 3, drain 4, and p-type semiconductor 2, for example, that provides current for switching the MTJ free layer 11. There is also a bottom electrode 5. Additional layers in the MTJ 13 are an AFM layer 8, pinned layer 9, insulating barrier 10, and capping layer 12.

A critical current for spin transfer switching (Ic), which is defined as $[(Ic^{+}+|Ic^{-}|)/2]$, for the present 180 nm node sub-micron MTJ having a top-down area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin insulating barrier 10 such as AlOx, MgO, or the like. In order for spin-transfer magnetization switching to be viable in the 90 nm technology node and beyond, the critical current density (Jc) must be lower than $10^6$ A/cm$^2$ to be driven by a CMOS transistor that can typically deliver 100 µA per 100 nm gate width. For STT-MRAM applications, the (ultra-small) MTJs must exhibit a high tunnel magnetoresistance ratio (TMR or dR/R) much higher than the conventional MRAM-MTJs that use AlOx as a barrier layer and have a dR/R of about 40% as stated by Z. Diao et. al in "Spin transfer switching and spin polarization in MTJ with MgO and AlOx barrier", Appl. Phys. Lett, 87, 232502 (2005). D. Djayaprawira et. al in "230% room temperature magnetoresistance in CoFeB/MgO/CoFeB MTJ", Appl. Phys. Lett. V 86, p. 092502 (2005) demonstrated that a highly oriented (001) CoFeB/MgO/CoFeB MTJ is capable of delivering dR/R>200%. Therefore, it is essential to find a way to combine a high TMR ratio of a CoFeB/MgO/CoFeB MTJ and the current driven switching capability necessary to make Spin-RAM (STT-MRAM) a practical technology.

To apply spin-transfer switching to MRAM technology, it is desirable to decrease Ic (and its Jc) by more than an order of magnitude so as to avoid an electrical breakdown of the MTJ device and to be compatible with the underlying CMOS transistor that is used to provide switching current and to select a memory cell. MagIC has previously disclosed an improved MTJ structure for a STT-MRAM device in a related application HMG06-042/51.

A routine search of the prior art was conducted and the following references were found. Hosomi et al. in "A novel non-volatile memory with spin torque transfer magnetization switching: Spin-RAM", 2005 IEDM, paper 19-1, present a Spin-RAM with spin-torque transfer magnetization switching for the first time and the device was fabricated with a $Co_{40}Fe_{40}B_{20}$/RF sputtered MgO/$Co_{40}Fe_{40}B_{20}$ (pinned layer/tunnel barrier/free layer) MTJ configuration. MTJ size is 100 nm×150 nm with an oval shape. A tunnel barrier layer is made of crystallized (100) MgO whose thickness is controlled to <10 Angstroms for the proper RA of about 20 ohm-µm² while dR/R or TMR (intrinsic) of the MTJ is 160%. Using a 10 ns pulse width, the critical current density, Jc, for spin transfer magnetization switching is about $2.5×10^6$ A/cm² which means Ic is equal to 375 µA. Due to a very small MTJ size, resistance distribution of Rp (low resistance state) and Rap (high resistance state) has a sigma (Rp_cov) around 4%. Thus, for a read operation, TMR (without bias)/Rp_cov=40 and this ratio is equivalent to that for a conventional CoFeB/AlOx/NiFe (pinned layer/tunnel barrier/free layer) MRAM MTJ configuration in which TMR is typically 40% with an Rp_cov of around 1.

A spin transfer magnetization switching of a $CO_{60}Fe_{20}B_{20}$/MgO/$Co_{60}Fe_{20}B_{20}$ MTJ is reported by Y. Huai et al. in "Spin transfer switching current reduction in magnetic tunnel junction based dual filter structures" in Appl. Physics Lett., V 87, p. 222,510 (2005). The nominal MTJ size is 125 nm×220 nm with an RA of ~50 ohm-µm² and dR/R=155%.

Referring to FIGS. 2, 3a-3b, and 4a-4b, a prior art process sequence for patterning a MTJ 20 is illustrated. In FIG. 2, a MTJ stack of layers is shown that has a bottom spin valve configuration, for example, in which an AFM layer 24, pinned layer 25, tunnel barrier layer 26, free layer 27, and capping layer 28 are sequentially formed on a bottom conductor 23 which has been laid down on a substrate comprised of a dielectric layer 22 and via 21. FIG. 3a depicts a patterned photoresist layer 29 formed on a top surface of capping layer 28 from a cross-sectional view and FIG. 3b is a top-down view of the photoresist pattern having a first dimension $a_1$ along an x-axis direction and a second dimension $b_1$ along a y-axis direction. FIG. 4a shows a cross-sectional view of MTJ 20 after the photoresist pattern is etched transferred through the MTJ stack of layers 24-28 and photoresist 29 is stripped.

FIG. 4b shows the MTJ 20 in FIG. 4a from a top view where hard mask 28 has dimensions $a_2$ and $b_2$ that are not necessary equal to $a_1$ and $b_1$, respectively, depending on etch conditions.

The fabrication process of a STT-MRAM is very challenging because of the small MTJ size where both easy-axis and hard axis dimensions must be controlled for optimum performance. In a CMOS process, the critical CD control for isolated and dense line features is in one dimension only and there are many well developed methodologies to control iso/dense CD for different applications. However, in MRAM processing, the critical CD involves a post (island) where a length along an easy-axis direction and a width along a hard-axis direction must simultaneously be controlled. Very little is understood in photolithography in terms of how to best control CD in a post pattern. Not only is dimensional control in an x-y plane crucial, but the thickness of the photoresist pattern in a z-direction plays an important factor. If the resist thickness is increased to provide extra process latitude for a subsequent etch step, then the aspect ratio (thickness/CD) may become too large and the post could collapse during image development. On the other hand, if the photoresist thickness is made thinner to allow smaller features to be printed with a larger process window without image collapse, then there may not be enough photoresist to serve as an adequate etch mask during a subsequent etch step where the photoresist pattern is transferred through the MTJ stack of layers. Methodologies have also been developed to control iso/dense line pattern collapse. However, the challenge is to apply existing photolithography techniques to MRAM MTJ fabrication. A process sequence is needed that enables two dimensional control of a MTJ post pattern having a CD of 100 nm or less while maintaining an adequate process latitude that does not suffer from pattern collapse.

In U.S. Pat. No. 6,984,529, a hard mask is patterned and then oxidized before the pattern is transferred through the MTJ stack of layers.

U.S. Pat. No. 7,067,866 describes a method of forming a MTJ element where the dimension of the MTJ element in the direction of a bit line is defined before a hard mask is deposited on the top surface. The hard mask is used to protect the MTJ element during a subsequent CMP process.

SUMMARY OF THE INVENTION

One objective of the present invention is to provide a process for fabricating a MTJ element for a STT-MRAM device that enables two dimensional (CD) control in easy-axis and hard-axis directions while printing a post pattern.

A second objective of the present invention is to provide a process for fabricating a MTJ element in a STT-MRAM that enables flexible etch end point control for determining hard-axis and easy-axis dimensions.

According to the present invention, these objectives are achieved by a fabrication sequence that involves two photolithography steps and two etch steps to create a plurality of MTJs in a post pattern design on a substrate. A MTJ stack of layers is formed by first depositing a stack of layers on substrate that may be a bottom electrode. In one aspect, the MTJ stack has a bottom spin valve configuration in which a seed layer, AFM layer, synthetic anti-ferromagnetic (SyAF) pinned layer, tunnel barrier layer, free layer, and a composite capping layer made of a hard mask spacer layer and an uppermost hard mask layer are sequentially formed on the substrate. All of the layers in the MTJ stack may be formed by sputtering or ion beam deposition (IBD). Thereafter, the MTJ stack of layers may be annealed in an easy-axis direction, hard-axis direction, or along both easy-axis and hard-axis directions. Next, a fabrication sequence that comprises two photolithography steps and two etch steps to define CDs in a hard axis direction and easy axis direction is followed.

In one embodiment, a first photoresist patterning step is employed to print a plurality of parallel lines on the top surface of the hard mask layer. For example, the plurality of parallel lines may be oriented in an x-axis direction that will become the easy-axis of the MTJ element. A first etch step is then used to transfer the photoresist pattern through the hard mask layer and stops on the hard mask spacer layer to generate a plurality of parallel hard mask lines. After the first photoresist is removed, a second photoresist layer is formed on the hard mask spacer layer and hard mask line pattern. A second photoresist patterning step is employed to print a plurality of lines in a hard axis direction, for example, that are preferably perpendicular to the plurality of hard mask lines. Optionally, the second photoresist patterning step results in a plurality of parallel photoresist lines that intersect the hard mask lines at an angle unequal to 90 degrees. Then a second etch step transfers the second photoresist pattern through the hard mask layer and stops on the hard mask spacer to form a post pattern that is essentially islands of hard mask arranged in rows and columns on the hard mask spacer layer. Once the second photoresist layer is removed, a third etch step is performed in which the post pattern is transferred through the remaining MTJ stack of layers. The hard mask is preferably <500 Angstroms thick to minimize topography during the second photoresist patterning step and thereby has a minimal impact on the process window. The hard mask spacer layer is used to provide additional etch resistance in order to satisfy etch margin requirements for subsequent CMP and BIT line etch processes. Optionally, the third etch step may stop on the tunnel barrier layer or in the free layer.

According to a second embodiment, the first photoresist pattern is transferred through the hard mask layer and the first etch continues through the entire stack of MTJ layers. Alternatively, the first etch step transfers the first photoresist pattern through the hard mask layer, hard mask spacer layer, and at least a portion of the free layer, and stops on or slightly above the tunnel barrier layer. From a top view, a plurality of hard mask lines is formed. If the end point is above the tunnel barrier layer, then an oxidation process is performed to oxidize the remaining free layer above the tunnel barrier for device insulation purposes. A separate patterning and etching sequence may be employed to pattern the bottom electrode and thereby electrically isolate the MTJ element from adjacent MTJ elements. Thereafter, a layer of insulating material such as $SiO_2$ or $Al_2O_3$ is deposited on the etched pattern to a level above the hard mask lines. A CMP step follows in order to planarize the insulation layer at a level equal to or slightly above that of the hard mask lines.

A second photoresist is coated on the planarized insulation layer and a second photoresist patterning step is performed to form a plurality of parallel lines that intersect the hard mark lines from a top view either at 90° angles or at an angle <90°. A second etch step is used to etch the hard mask layer and continue through the MTJ stack and stops on the bottom electrode or at an end point on or slightly above the tunnel barrier layer. Any remaining photoresist is removed. If the etching end point is above the tunnel barrier layer, then an oxidation process is employed to oxidize the remaining free layer above the tunnel barrier for device insulation purposes. Since the insulation layer is planarized before the second photoresist patterning step, the hard mask thickness is not constrained by the second patterning process.

BRIEF DESCRIPTION OF THE DRAWINGS

FIG. 1 is a cross-sectional view showing a conventional memory cell in a STT-MRAM device.

FIG. 2 is cross-sectional view of a MTJ stack of layers formed on a bottom electrode prior to patterning a MTJ element according to a conventional fabrication method.

FIG. 3a and FIG. 3b are cross-sectional and top-down views, respectively, of a photoresist post pattern formed by a conventional method on the MTJ stack in FIG. 2.

FIG. 4a and FIG. 4b are cross-sectional and top-down views, respectively, of the post pattern in FIGS. 3a, 3b that has been transferred through the MTJ stack of layers according to a conventional fabrication method.

DETAILED DESCRIPTION OF THE INVENTION

The present invention is a method of fabricating a MTJ element in a STT-MRAM device that enables two dimensional (CD) control in easy-axis and hard-axis directions. The fabrication process described herein also provides flexible etch end point control. Although the exemplary embodiment refers to a STT-MRAM, the present invention also encompasses other devices comprised of MTJ elements such as MRAM and GMR sensors in read/write heads. Further, the drawings are not necessarily drawn to scale and the relative sizes of various elements may differ from those in an actual device.

Figure 5:
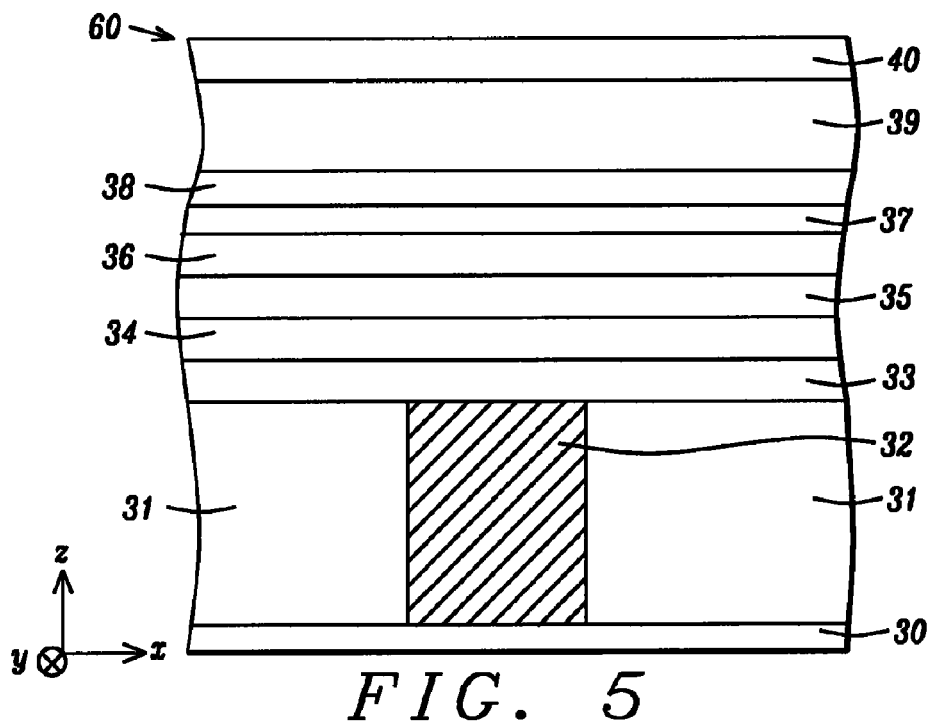
FIG. 5 is a cross-sectional view of a MTJ stack of layers formed according to one embodiment of the present invention.

A method of forming a MTJ element in a STT-MRAM structure according to a first embodiment of the present invention will now be described. Referring to FIG. 5, a partially completed STT-MRAM structure 60 is shown that includes a substrate 30 which may be a CMOS substructure used in the art that typically contains devices such as transistors and diodes. A first insulation layer 31 comprised of $Al_2O_3$, silicon oxide, or the like is disposed on the substrate 30. There is a metal contact 32 to the CMOS substructure 31 formed within and coplanar with the first insulation layer 31. The metal contact 32 may be made of copper, for example. It should be understood that there is a plurality of metal contacts 32 formed within the first insulation layer 31, and there is a plurality of STT-MRAMs 60 formed on the substrate 30. However, only one metal contact and one STT-MRAM are depicted to simplify the drawing. There is also a plurality of bit lines and word lines (not shown) formed in a cross-point architecture as appreciated by those skilled in the art. For example, a MTJ element is formed between a bottom electrode layer and a bit line at each location where a bit line crosses over a word line.

A bottom electrode layer 33 is formed on the first insulation layer 31 and contacts the metal contact 32. Typically, the bottom electrode layer 33 is interconnected to an underlying transistor (not shown) in substrate 30. The bottom electrode layer 33 may be a composite layer comprised of a lower seed layer, middle conductive layer, and upper capping layer (not shown). Moreover, the bottom electrode layer 33 may be a sectioned line, for example, that has a rectangular shape in the x, y plane and a thickness in the z direction. Alternatively, the bottom electrode layer 33 may be a bit line that is aligned orthogonally to an underlying word line (not shown) and to a subsequently formed second word line above the MTJ. In one embodiment where the bottom conductor layer has a seed layer/conductive layer/capping layer configuration, the seed layer may be comprised of NiCr, Ta, or TaN. The conductive layer may be made of Ru, Rh, Ir or other metals such as Au, Cu, or α-Ta. The capping layer may be an amorphous Ta layer, for example, that serves to promote uniform and dense growth in subsequently formed MTJ layers.

An MTJ stack of layers is now formed on the bottom electrode layer 33. It should be understood that the MTJ stack may be formed in the same process tool as the bottom conductor layer. For instance, the bottom electrode layer 33 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode layer 33 and overlying MTJ layers may be formed after a single pump down of the sputter system to enhance throughput.

In a preferred embodiment, the MTJ stack of layers is fabricated on the bottom electrode layer 33 by sequentially forming an AFM layer 34, pinned layer 35, SyAF pinned layer 36, tunnel barrier layer 37, free layer 38, hard mask spacer layer 39, and a hard mask layer 40. The seed layer 34 has a thickness of about 40 to 60 Angstroms and may be made of NiCr, NiFe, NiFeCr, or other suitable materials used in the art. When the seed layer 34 is grown on an amorphous Ta capping layer in the bottom conductor layer 33, a smooth and dense (111) seed layer structure results that promotes smooth and densely packed growth in subsequently formed MTJ layers.

The AFM layer 35 may be made of an alloy such as MnPt, IrMn, NiMn, OsMn, RuMn, RhMn, PdMn, RuRhMn, or MnPtPd. In the exemplary embodiment, the AFM layer is magnetically aligned in the y-axis direction. An external magnetic field may be applied during the deposition of an MTJ layer such as an AFM layer or a ferromagnetic (FM) layer to influence a magnetization along a certain axis.

The pinned layer 36 preferably has a SyAF structure with an AP2/coupling layer/AP1 configuration (not shown). Use of a SyAF pinned layer in the MTJ structure not only improves thermal stability but also reduces the interlayer coupling field (offset field) applied to the free layer. The AP2 layer is formed on the AFM layer 35 and is preferably comprised of CoFe with a composition of about 25 atomic % Fe and with a thickness of about 20 to 30 Angstroms. The magnetic moment of the AP2 layer is pinned in a direction antiparallel to the magnetic moment of the AP1 layer. A slight difference in thickness between the AP2 and AP1 layers produces a small net magnetic moment for the SyAF pinned layer 35 along the y-axis. Exchange coupling between the AP2 layer and the AP1 layer is facilitated by a coupling layer that is preferably comprised of Ru with a thickness of about 7.5 Angstroms although Rh or Ir may be used instead of Ru. The AP1 layer on the Ru coupling layer may be comprised of CoFe or amorphous CoFeB and has a thickness of about 15 to 25 Angstroms.

Above the SyAF pinned layer 36 is formed a thin tunnel barrier layer 37 that is preferably MgO. The MgO tunnel barrier layer may be formed by depositing a first Mg layer about 8 Angstroms thick followed by an in-situ radical oxidation (ROX) or natural oxidation (NOX) in an oxidation chamber, and then deposition of a second Mg layer about 2 to 6 Angstroms thick. Optionally, the tunnel barrier layer 37 may be comprised of other materials such as AlOx or AlTiOx.

It has been shown that a MTJ made with a crystalline MgO barrier layer and a CoFeB free layer is capable of delivering a very high dR/R as described in the prior art references. High dR/R is a result of coherent tunneling in which electron symmetry of the ferromagnetic electrode is preserved in tunneling through the crystalline MgO barrier. An MgO tunnel barrier is also preferred for optimizing MTJ performance with respect to Jc, RA, and Rp_cov.

The free layer 38 formed on the tunnel barrier layer 37 may be comprised of the same amorphous CoFeB composition as in the AP1 portion of the pinned layer 36. The free layer 38 has a thickness between 20 and 30 Angstroms and is magnetically aligned along the y-axis (pinned layer direction). The present invention also anticipates that one or more other materials such as CoFe and NiFe may be employed in the free layer 38 to form a CoFe/NiFe composite or a composite with CoFeB.

One important feature of the present invention is a composite capping layer comprised of a hard mask spacer layer 39 on the free layer and a hard mask layer 40 formed on the hard mask spacer layer. The hard mask spacer 39 may be comprised of Cu or MnPt and has a thickness of 200 to 800 Angstroms while the hard mask layer 40 may be made of Ta and preferably has a thickness less than 500 Angstroms to allow an adequate process window in a subsequent photolithography step. A hard mask spacer layer 39 with an etch selectivity of about 5 to 15 relative to the hard mask layer 40 is advantageously used to enable a wider etch margin during subsequent etch steps that defined the critical dimensions (CDs) along easy-axis and hard-axis directions.

The present invention also encompasses an annealing step after all of the MTJ layers have been deposited. For example, in the exemplary embodiment, the MTJ stack of layers may be annealed in a vacuum by applying a magnetic field of 10K Oe in magnitude along the easy axis for 1 to 5 hours at a temperature of about 250° C. to 300° C. An anneal process may also be performed along a hard-axis direction.

Figure 6A:
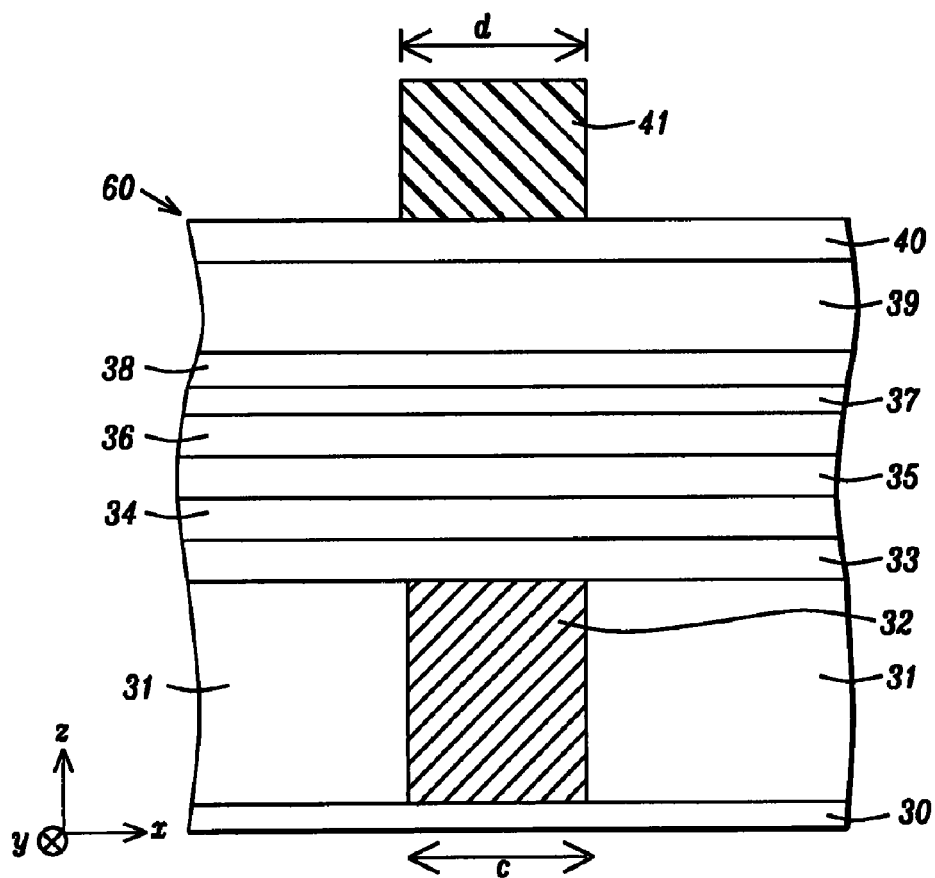
FIG. 6a and FIG. 6b are cross-sectional and top views, respectively, of a first photoresist pattern formed on the MTJ stack of layers in FIG. 5.
Figure 6B:
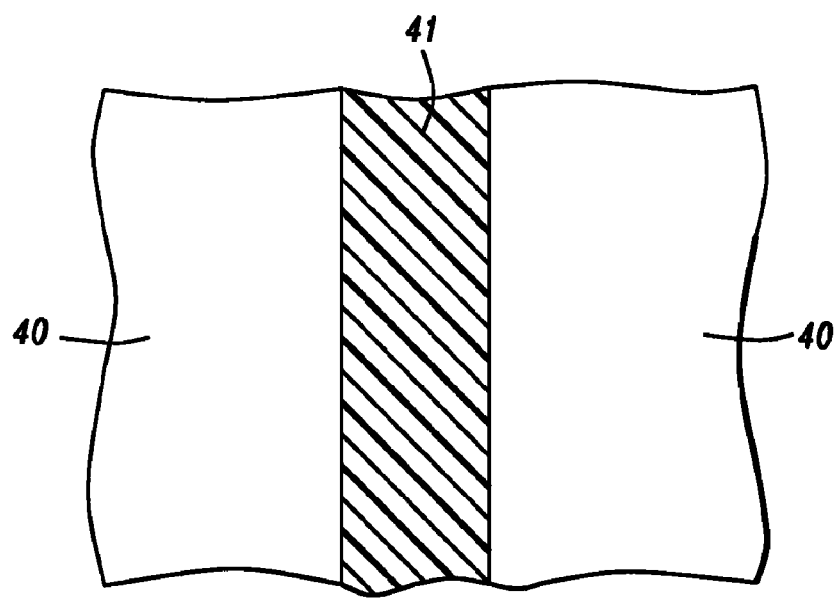

Referring to FIGS. 6a-6b, after all of the MTJ layers have been deposited and annealing is completed, the next step in fabricating a MTJ element is coating and patterning a first photoresist layer 41 to generate a line having a width d in an x-axis direction on the hard mask layer 40. As mentioned previously, it should be understood that a plurality of parallel photoresist lines 41 are formed and each have a width d but only one is depicted in the exemplary embodiment to simplify the drawing. The width d corresponds to the desired critical dimension (CD) of the MTJ element in the x-axis direction which may be either the hard-axis or easy-axis direction. A key feature of the fabrication process is to generate a CD along a hard-axis direction independent of generating a CD along an easy axis direction and thereby provide better control of the area (from a top-view) of the MTJ element. As a result, the plurality of MTJ elements formed by the fabrication method described herein will have a more uniform shape and more a uniform performance than achieved by a conventional method as shown in FIGS. 2-4b. The method of the present invention is especially advantageous when at least one of the hard-axis CD and easy-axis CD is about 100 nm or less.

Figure 7A:
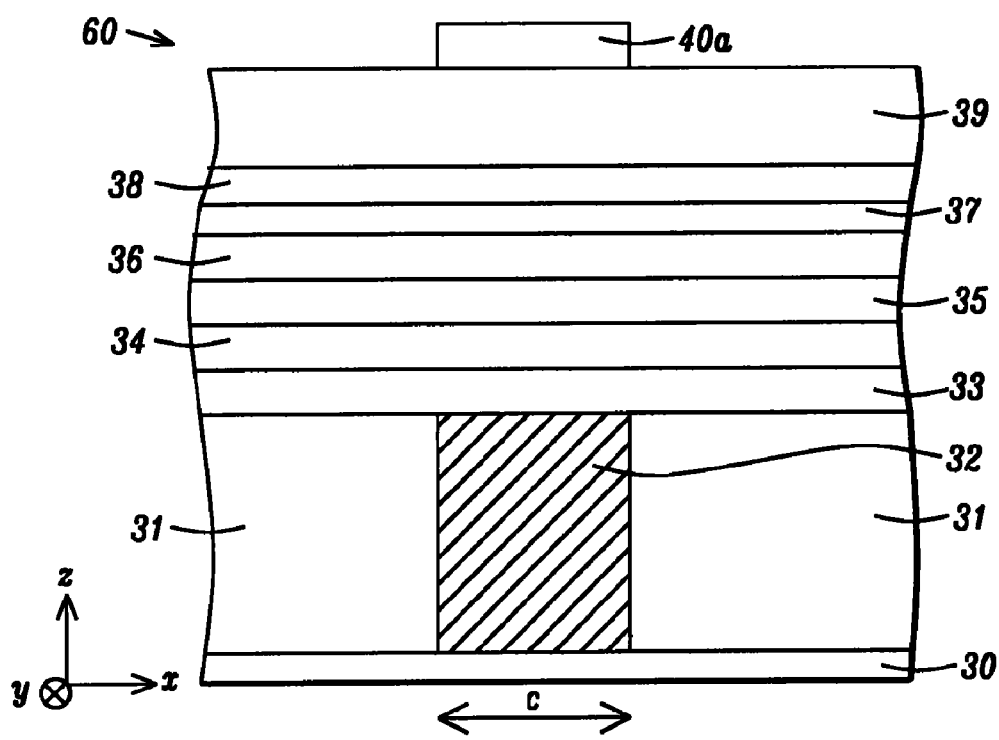
FIG. 7a and FIG. 7b are cross-sectional and top-down views, respectively, after an etch transfer of the first photoresist pattern through the hard mask (uppermost MTJ layer) and removal of the photoresist layer.
Figure 7B:
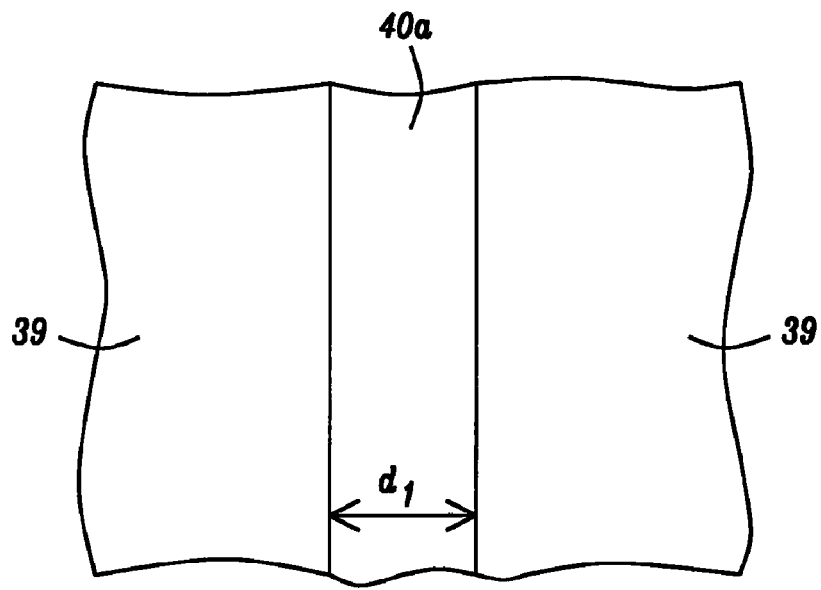

Referring to FIGS. 7a, 7b, the first photoresist layer 41 is employed as an etch mask during a first etch step such as a Reactive Ion Etch (RIE) process that removes regions of the hard mask layer 40 which are not protected by the etch mask. The RIE process may be comprised of $CF_4$ or another fluorocarbon gas and stops on the hard mask spacer layer 39 because of the high etch selectivity mentioned previously. In other words, the exposed regions of the hard mask layer 40 etch at a substantially higher rate than the hard mask spacer layer 39, and preferably at least 5 to 15 times faster during the fluorocarbon etch. As a result, the parallel line pattern is transferred into the hard mask and generates a plurality of parallel lines 40a. Those skilled in the art will appreciate that there may be some linewidth change from d in first photoresist layer 41 to $d_1$ in hard mask lines 40a since the etching process does not necessarily yield a perfect transfer due to such factors as photoresist erosion. Any remaining photoresist layer 41 is then stripped by a conventional method.

Figure 8A:
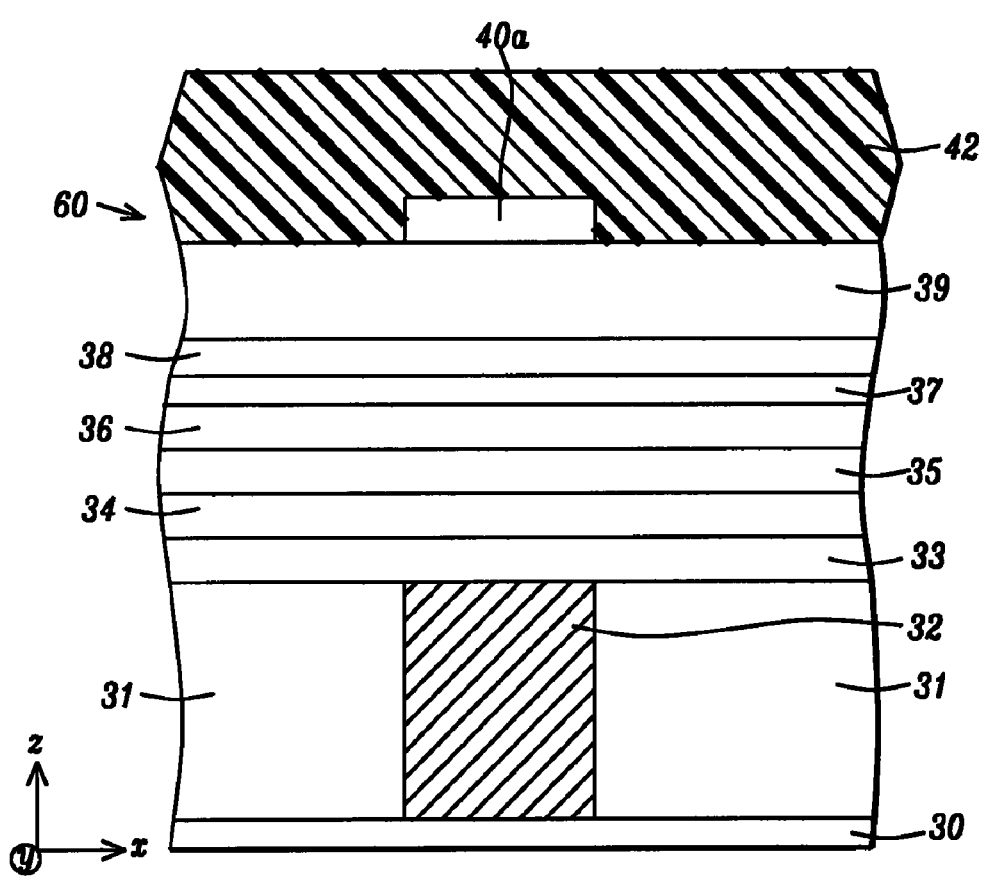
FIGS. 8a, 8b are cross-sectional and top-down views, respectively, of a second photoresist pattern formed on the partially etched MTJ stack of layers in FIGS. 7a, 7b.
Figure 8B:
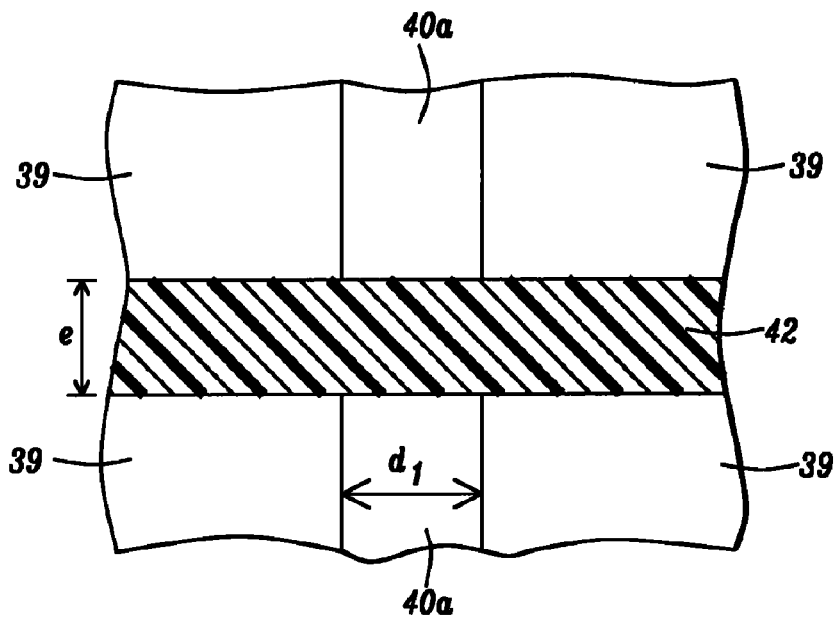

Referring to FIGS. 8a, 8b, a second photoresist layer 42 is coated on the partially formed STT-MRAM 60 after the first etch step. A second photolithography process is employed to form a second parallel line pattern that intersects the plurality of parallel hard mask lines 40a. Only one second photoresist line 42 in depicted in the second parallel line pattern in order to simplify the drawings. In one aspect, the second parallel line pattern is formed perpendicular to the plurality of parallel hard mask lines 40a. Optionally, the second parallel line pattern comprised of second photoresist line 42 may intersect the hard mask lines 40a at an angle between 0 and 90°. In the exemplary embodiment, the second photoresist line 42 has a width e in a y-axis direction that corresponds to the CD in the easy-axis direction. Alternatively, when the x-axis represents the easy-axis direction, then the y-axis corresponds to the hard-axis direction. In either case, it is critical that the dimensions d and e be generated in separate photolithography steps to provide better control of the area (e×d) and ($e_1 \times d_1$ in FIG. 9b). Although the exemplary embodiment depicts the relative sizes of d and e to be about equal, the present invention also encompasses an embodiment wherein the easy-axis dimension may be up to about 2 times greater than the hard-axis dimension.

Figure 9A:
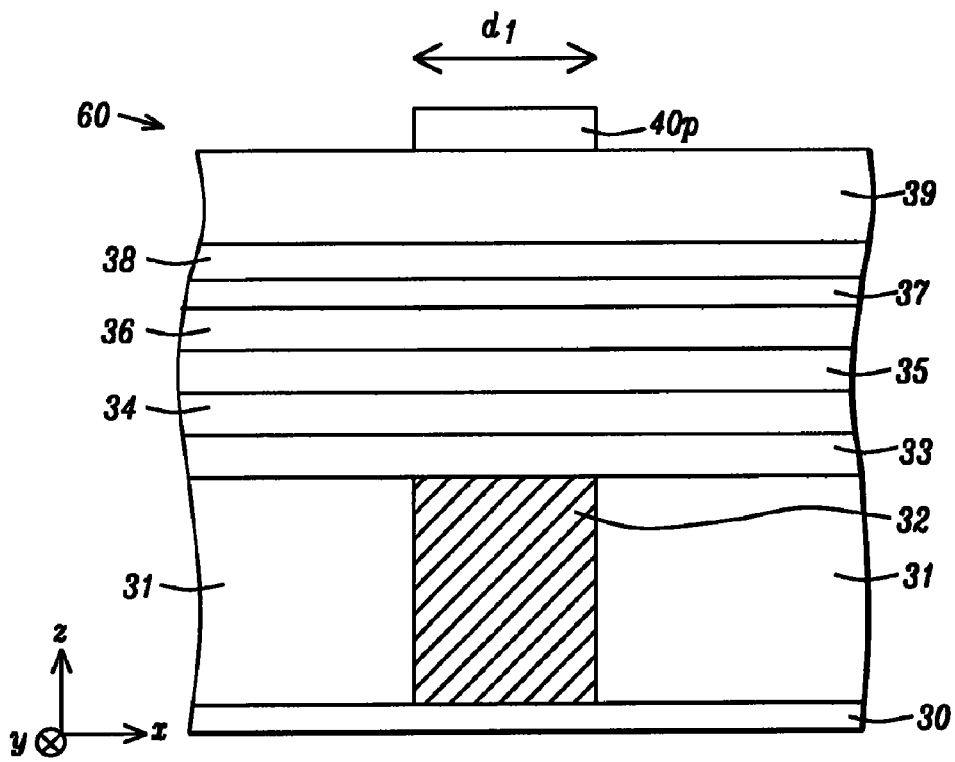
FIG. 9a and FIG. 9b are cross-sectional and top-down views, respectively, after a second etch transfer of the second photoresist pattern through the hard mask at the top of the MTJ stack of layers, and removal of the photoresist layer.
Figure 9B:
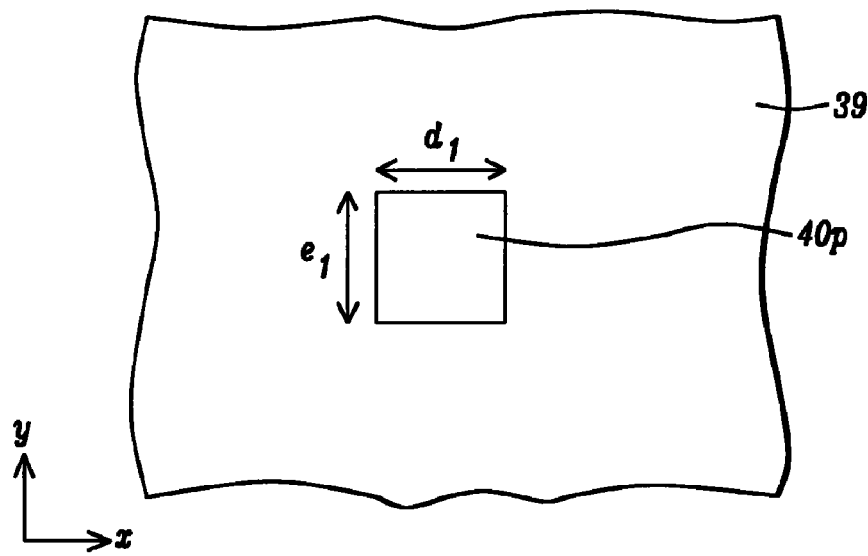

Referring to FIGS. 9a, 9b, a second etch step is performed to transfer the second parallel line pattern comprised of second photoresist lines 42 into the remaining hard mask layer comprised of parallel lines 40a. A similar etch chemistry and conditions to those used in the first etch step may be employed. The second etch step stops on the hard mask spacer layer 39 and thereby forms a post pattern comprised of posts (islands) 40p having a dimension $d_1$ along the x-axis and $e_1$ along the y-axis. Note that the second etch transfer generates a width $e_1$ in the hard mask layer that may be slightly different than e due to the nature of the etching process. Any remaining second photoresist layer 42 is stripped after the second etch step.

From a top-view perspective in FIG. 9b, the post 40p is shown as having a square or rectangular shape. It should be understood, however, that the corners on the post 40p may be rounded somewhat because of small linewidth variations in the second photoresist line 42 where the line crosses over the edges of hard mask layer 40a. These linewidth variations can translate into rounded corners on the post 40p following the second etch step. Therefore, the present invention also anticipates a hard mask post 40p that has a circular or elliptical shape which is desirable for MTJ elements. Unlike conventional MRAM where an elliptical MTJ shape is preferred in order to maintain the desired magnetic stability, the MTJ shape for a STT-MRAM is believed not to be so dependent on shape and a rectangular or elliptical MTJ are equally acceptable. When $e_1$ is unequal to $d_1$, the easy-axis direction is preferably the one that has the greater dimension $e_1$ or $d_1$.

Figure 10A:
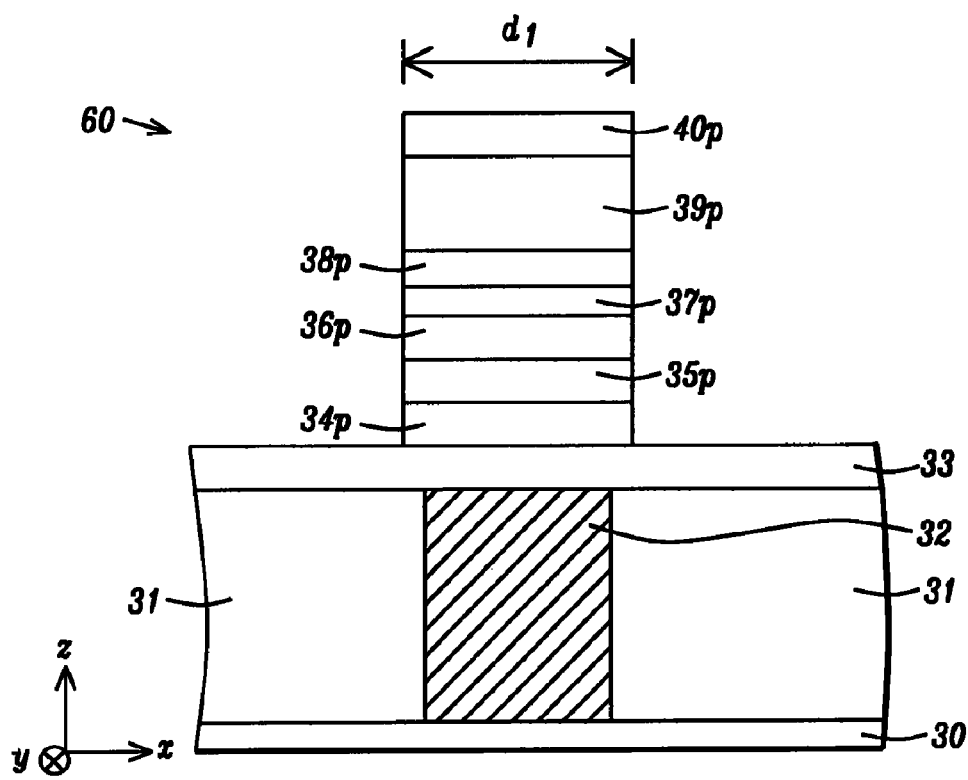
FIG. 10a and FIG. 10b are cross-sectional and top-down views, respectively, after the post pattern in the hard mask is transferred through the MTJ stack of layers to form a MTJ element according to a first embodiment of the present invention.
Figure 10B:
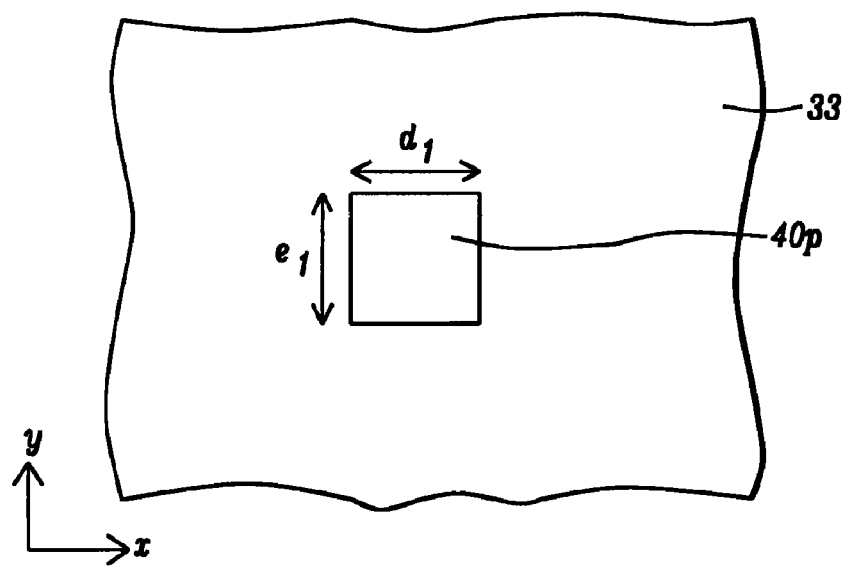

Referring to FIGS. 10a, 10b, the hard mask post shape 40p is transferred through the remaining stack of MTJ layers by a third etch step that is preferably a RIE process. As a result, layers 34-39 are transformed into post shapes that have essentially the same dimensions ($d_1$, $e_1$) as hard mask post 40p from a top-view in FIG. 10b and the resulting MTJ element has essentially vertical sidewalls. Those skilled in the art will appreciate that a portion of the hard mask layer shown as hard mask post 40p may be eroded during the third etch step which stops on the bottom electrode layer 33. The third etch step may comprise $CH_3OH$, $C_2H_5OH$, or $CO/NH_3$ which selectively etches exposed regions of the hard mask spacer 39 substantially faster than hard mask post 40p.

Alternatively, the hard mask post shape 40p is transferred through the hard mask spacer 39 and at least a portion of the free layer 38 (not shown) during the third etch step. All of the MTJ layers below hard mask post 40p preferably have an etch rate of about 5 to 15 times faster than the hard mask post during the third etch step. In this embodiment, the resulting MTJ element may be comprised of a post structure having layers 38p-40p formed on a stack of layers 34-37. When the third etch step stops inside the free layer 38, then the remaining portion of the free layer above the tunnel barrier layer 37 and not underlying the free layer post 38p is oxidized to electrically insulate the STT-MRAM 60 from adjacent STT-MRAM devices. For example, a natural oxidation (NOX) or radical oxidation (ROX) may be employed to transform the remaining free layer 38 to an insulation layer (not shown). Typically, the oxidation is a short process and only a small amount of oxygen is expected to diffuse into the free layer. Even so, it is known in the art that a small amount of oxygen dopant in a free layer may actually enhance the performance of a MTJ.

Subsequent process steps to complete the STT-MRAM 60 are not illustrated but preferably comprise etching the bottom electrode layer 33 to form a plurality of bottom electrodes (not shown) and deposition of an insulation layer on the plurality of bottom electrodes to a level that covers the hard mask post 40p. Alternatively, the bottom electrode layer 33 may be etched prior to depositing the MTJ stack of layers and etching to form MTJ elements. Once the third etch step is completed and the bottom electrodes are defined, a CMP step may be performed to planarize the insulation layer to a level that is about coplanar with the hard mask post 40p. In one embodiment, the CMP step stops above the hard mask post 40p and a RIE process is used to remove an upper portion of the insulation layer and thereby uncover the hard mask post 40p. Thereafter, a plurality of bit lines may be formed on the insulation layer by an electroplating method, for example. One of the bit lines contacts the top surface of hard mask post 40p.

In a second embodiment of the present invention represented by the process steps shown in FIGS. 11a-16b, a CD in an easy-axis dimension and a CD in a hard-axis dimension are again defined in separate photolithography steps involving parallel line patterns. However, the first and second etch steps described in the first embodiment are modified to allow additional flexibility in the STT-MRAM design.

Figure 11A:
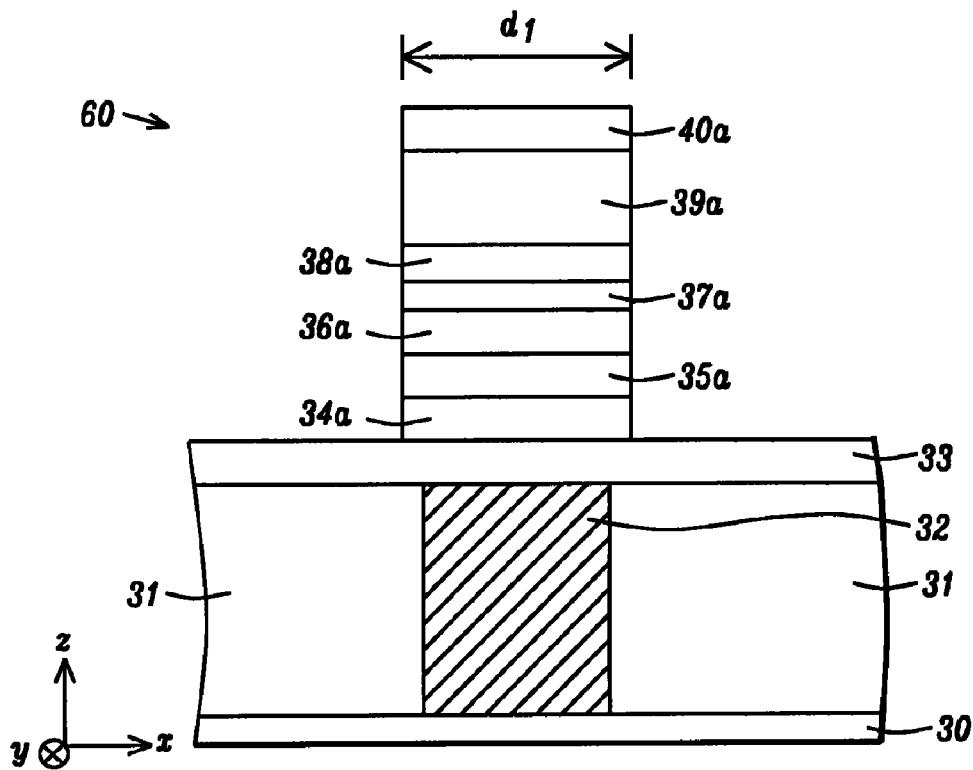
FIG. 11a and FIG. 11b are cross-sectional and top-down views, respectively, after the first photoresist pattern in FIGS. 6a, 6b is transferred by an etch step through the MTJ stack of layers according to a second embodiment of the present invention.
Figure 11B:
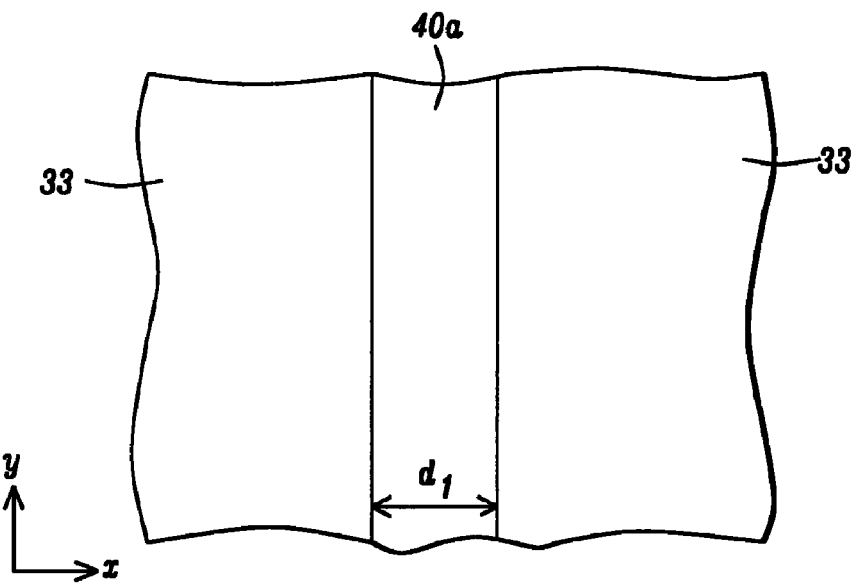

Referring to FIGS. 11a, 11b, the first etch step after the first photolithography patterning step is modified. The parallel photoresist line pattern shown in FIGS. 6a, 6b is transferred through the entire stack of MTJ layers 34-40 to provide a linewidth $d_1$ in the x-axis direction after the first etch step. Note that the seed layer 34a, AFM layer 35a, pinned layer 36a, tunnel barrier layer 37a, free layer 38a, hard mask spacer layer 39a, and hard mask layer 40a all have essentially the same width $d_1$. Any photoresist remaining after the first etch step is stripped at this point.

In an alternative embodiment, the first etch step transfers the parallel line pattern through the hard mask layer 40, hard mask spacer 39, and at least an upper portion of the free layer 38. In this example (not shown), the first etch may stop on the tunnel barrier layer 37 or in the free layer 38. In the latter case, the remaining portion of the free layer 38 above the tunnel barrier is oxidized as in the first embodiment to insulate the upper section 38a-40a of the MTJ element from adjacent STT-MRAMs 60. As noted earlier, a small amount of oxygen may diffuse into the upper portion of the free layer designated as free layer 38a.

Figure 12:
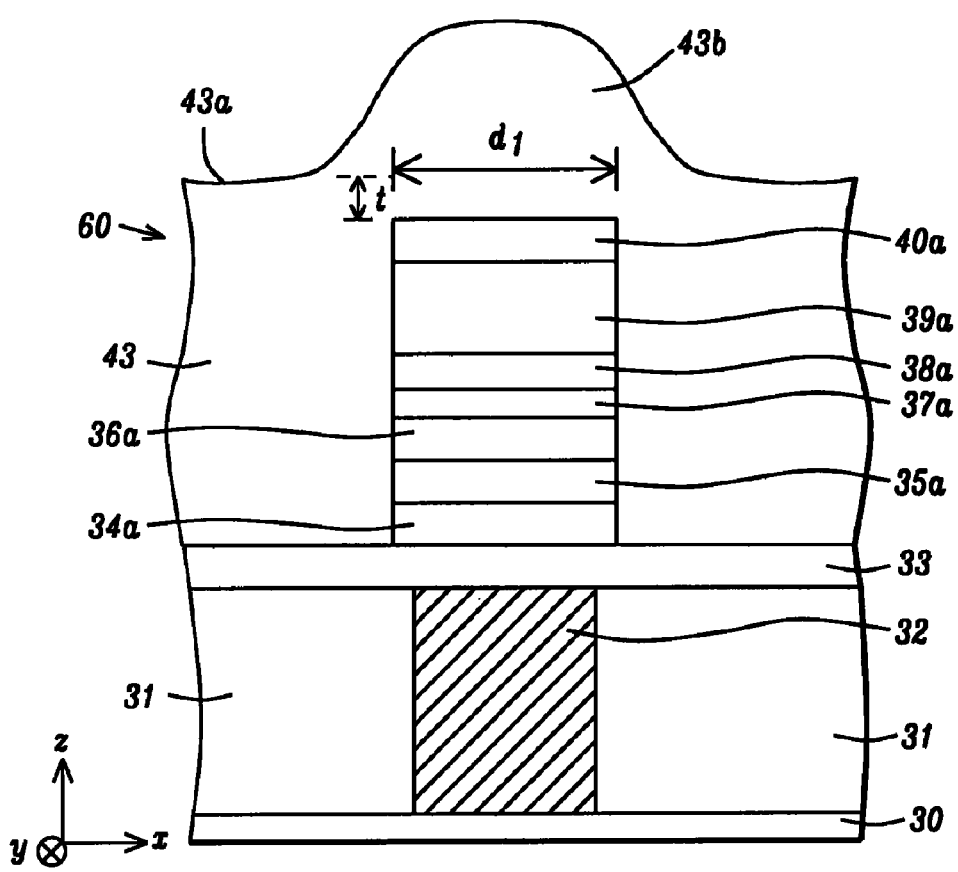
FIG. 12 is a cross-sectional view of the etched structure in FIG. 11a after an insulation layer is deposited to a level that covers the hard mask layer.

Referring to FIG. 12, a second insulation layer 43 made of $SiO_2$, $Al_2O_3$, or other dielectric material is deposited on the partially formed STT-MRAM 60 in FIGS. 11a-11b. The top surface 43a of the second insulation layer is planar except for a bump 43b formed over hard mask layer 40a. Preferably, the top surface 43a is a certain distance t above the hard mask layer 40a. The deposition may take place in a CVD chamber outside the sputter deposition mainframe used to deposit the MTJ layers. However, to improve throughput, the insulation layer may also be laid down in a sputter chamber within the sputter deposition mainframe.

Figure 13A:
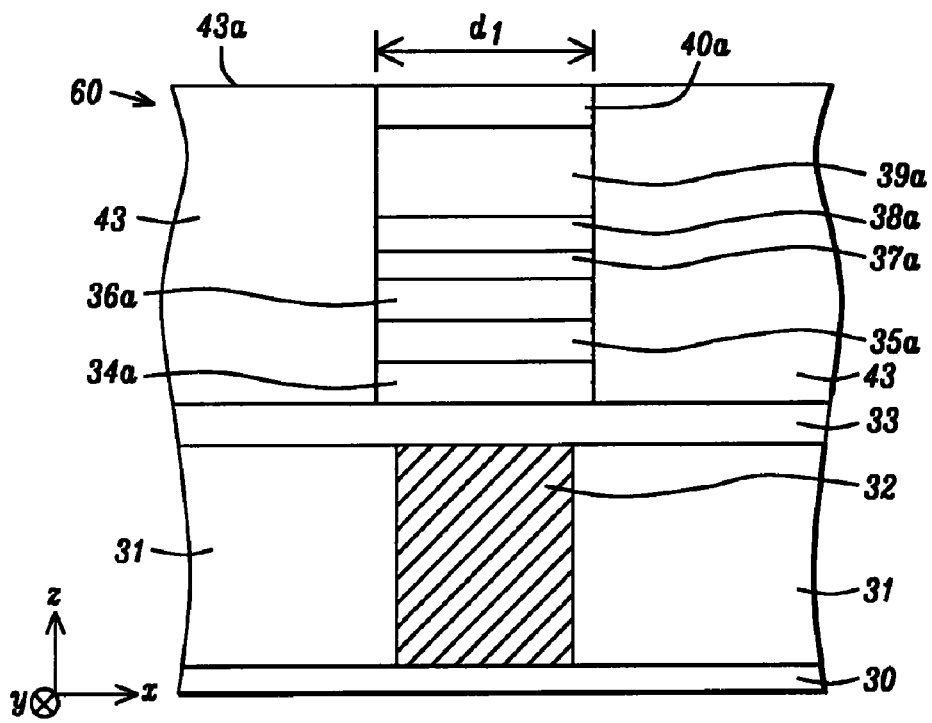
FIG. 13a and FIG. 13b are cross-sectional and top-down views, respectively, of the MTJ structure in FIG. 12 after a CMP step to planarize the insulation layer.
Figure 13B:
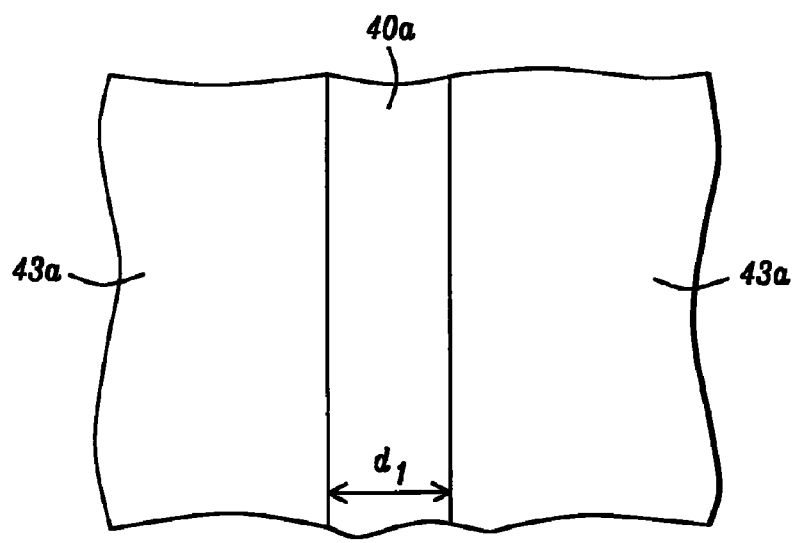

Referring to FIGS. 13a-13b, a CMP process is performed to planarize the second insulation layer 43 so that the top surface 43a is coplanar with hard mask layer 40a. Optionally, the top surface 43a may be planarized at a level that is above the hard mask layer 40a.

Figure 14A:
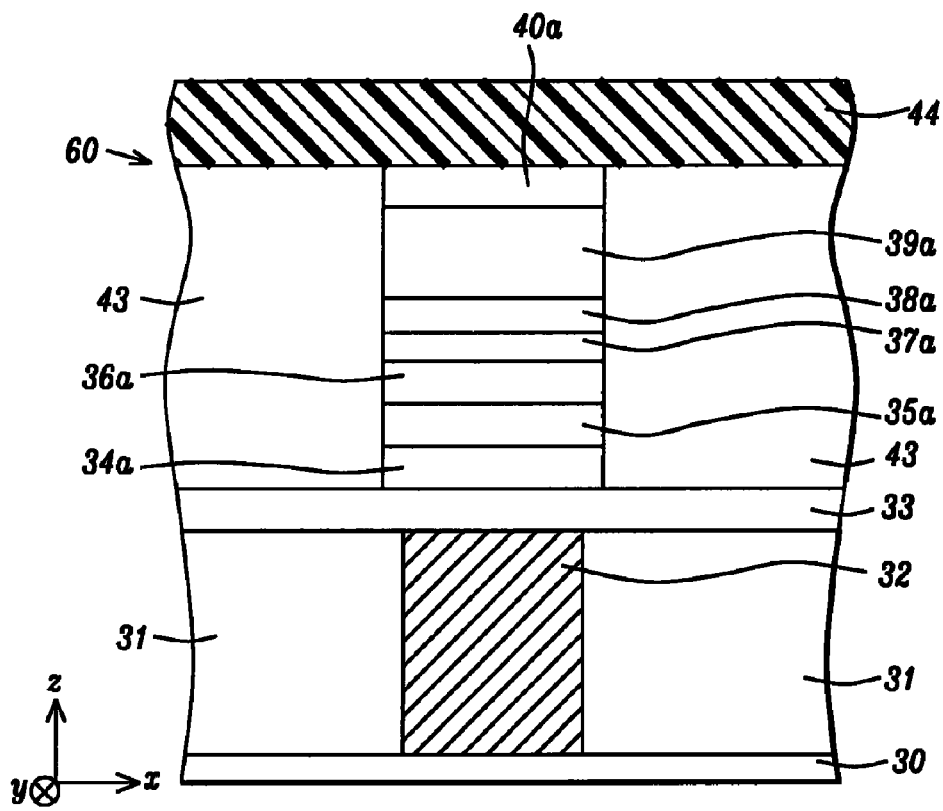
FIG. 14a and FIG. 14b are cross-sectional and top-down views, respectively, of the MTJ structure in FIGS. 13a, 13b after a second photoresist pattern is formed on the hard mask and insulation layer according to the second embodiment.
Figure 14B:
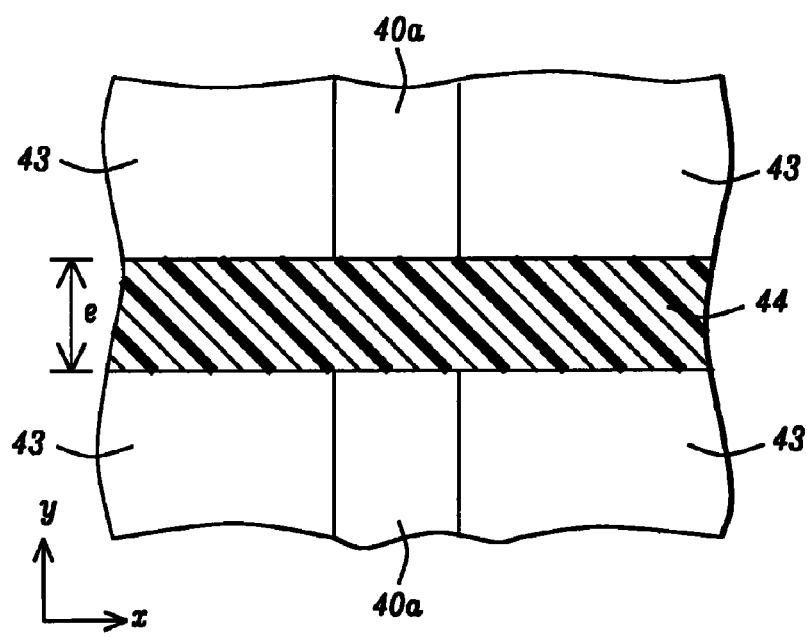

In FIGS. 14a-14b, a second photoresist layer is coated on the second insulation layer 43 and is patterned in a second photolithography step to generate a parallel line pattern comprised of photoresist lines 44. In one aspect, a photoresist line 44 is formed perpendicular to the hard mask lines 40a. However, the present invention also encompasses an embodiment in which a photoresist line 44 intersects the hard mask lines 40a at an angle between 0 and 90°. As in the first embodiment, the photoresist lines 44 formed in the second photoresist patterning step have a width e in the y-axis direction that corresponds to the CD in hard-axis direction or easy-axis direction of the subsequently formed MTJ element. Since the second photoresist layer is coated on a planar surface, the process window for forming the parallel photoresist lines 44 should be greater than in the first embodiment where the second photoresist layer is coated over topography (hard mask lines 40a above hard mask spacer 39).

Figure 15A:
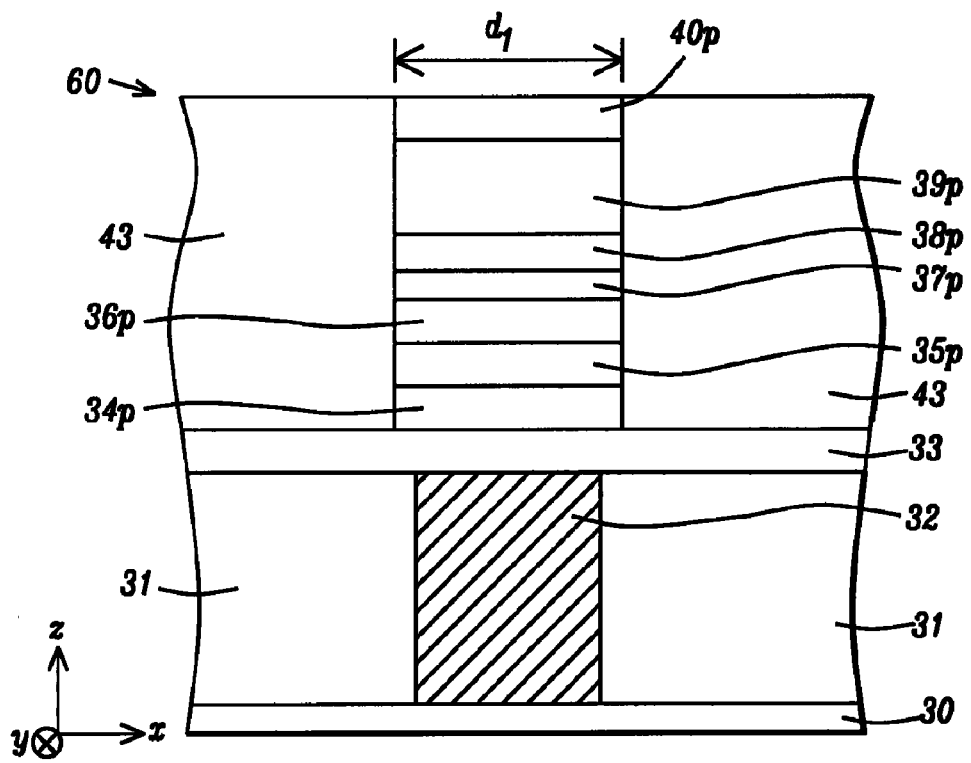
FIG. 15a and FIG. 15b are cross-sectional and top-down views, respectively, after the second photoresist pattern is etch transferred through the MTJ stack of layers.
Figure 15B:
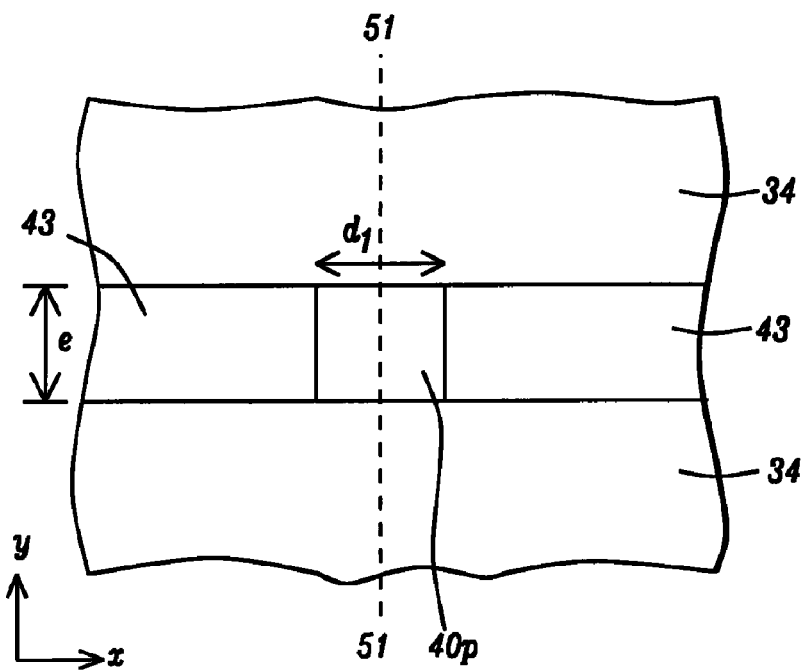

Referring to FIGS. 15a-15b, a second etch step is performed to transfer the line pattern in the second photoresist layer through the MTJ stack of layers 34-40. From a top-view, the resulting hard mask post 40p has a width $d_1$ along the x-axis and a width $e_1$ along the y-axis. In a design where $d_1$ is unequal to $e_1$, the easy-axis is generally the axis associated with the larger of the two values ($d_1$ or $e_1$). Furthermore, the remaining layers 34a-39a in the MTJ stack of layers are transformed into post shapes 34p-39p (from a top-view) having essentially the same area dimensions ($d_1 \times e_1$) as the hard mask post 40p. The second insulation layer 43 also has a width $e_1$ along the x-axis and is coplanar with the hard mask post 40p.

Figure 16A:
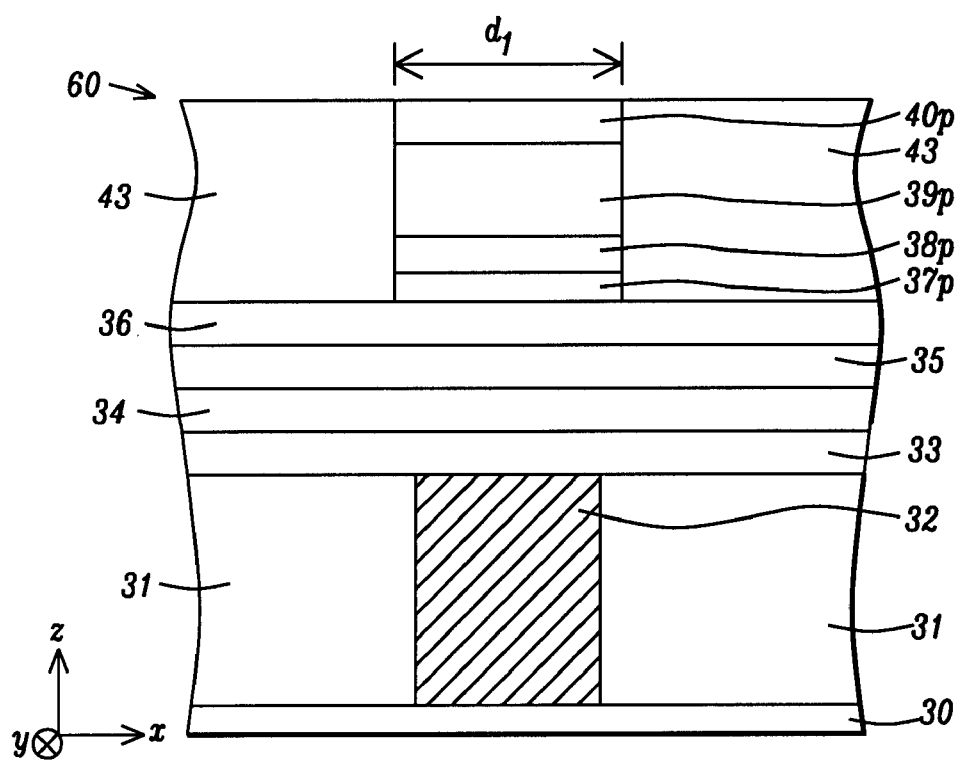
FIG. 16a and FIG. 16b are cross-sectional and top-down views, respectively, after the second photoresist pattern is etch transferred through the free layer and stops on the tunnel barrier layer according to another embodiment of the present invention.
Figure 16B:
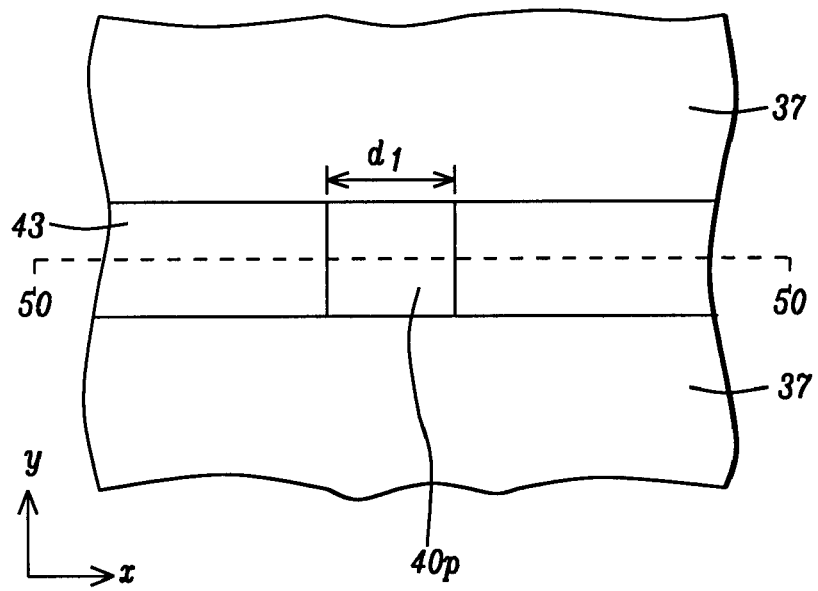

In FIGS. 16a-16b, an alternative embodiment is depicted in which the post shape 40p is transferred through the hard mask spacer 39 and at least a portion of the free layer 38 during the second etch step. In this embodiment, the resulting MTJ element may be comprised of a post structure having layers 38p-40p formed on a stack of layers 34-37. When the second etch step stops inside the free layer 38, then the remaining portion of the free layer above the tunnel barrier layer 37 is oxidized to electrically insulate the STT-MRAM 60 from adjacent STT-MRAM devices. For example, a NOX or ROX process may be employed to transform the remaining free layer 38 to an insulation layer (not shown).

To summarize the second embodiment, the combination of the two photolithography steps and two etch steps that determine the CDs along the easy-axis and hard-axis directions may result in at least four configurations represented by FIGS. 15a-15b and FIGS. 16a-16b. In one aspect, the first etch and second etch may both stop on the bottom electrode layer 33. In a second configuration, the first etch and second etch may both stop on the tunnel barrier layer 37 or inside the free layer 38. In a third configuration, one etch may stop on the bottom electrode and the other etch may stop on the tunnel barrier layer (or inside the free layer). Thus, FIG. 15b may represent a view from the plane 51-51 that includes the hard axis and FIG. 16b may represent a view from the plane 50-50 that includes the easy-axis. The present invention also anticipates that the plane 50-50 may include the hard-axis and plane 51-51 may include the easy-axis.

Subsequent process steps to complete the STT-MRAM 60 are not illustrated but preferably comprise etching the bottom electrode layer 33 to form a plurality of bottom electrodes, and deposition of a third insulation layer on the plurality of bottom electrodes (or on tunnel barrier layer 37) to a level that covers the hard mask post 40p. Then, a CMP step may be performed to planarize the third insulation layer to a level that is about coplanar with the hard mask post 40p and second insulation layer 43. In one embodiment, the CMP step may stop above the hard mask post 40p and is followed by a RIE process to remove an upper portion of the third insulation layer and uncover the hard mask post 40p. Thereafter, a plurality of bit lines may be formed on the third insulation layer. One of the bit lines contacts the top surface of hard mask post 40p.

Both embodiments provide an advantage over existing MTJ fabrication methods in that the CD for the easy-axis dimension and the CD for the hard-axis dimension are determined in separate photolithography steps and thereby enable greater control especially in terms of uniformity of the MTJ area ($e_1 \times d_1$) from a top view. Separate photolithography steps also enable the photolithography exposure tool to print smaller CDs with a larger process window since only one dimensional control is needed for each step rather than two dimensional control. Furthermore, a thicker photoresist layer may be employed for the first and second photolithography steps since there is substantially less danger for line collapse than post collapse in two dimensional CD imaging methods. Thus, the lifetime of photolithography exposure tools can be extended and less rework is necessary which are both cost-effective outcomes. An additional benefit provided by the present invention is the flexibility in selecting different etching end points when defining the easy-axis and hard-axis dimensions.

While this invention has been particularly shown and described with reference to, the preferred embodiment thereof, it will be understood by those skilled in the art that various changes in form and details may be made without departing from the spirit and scope of this invention.

We claim:

1. A method of fabricating a MTJ element having essentially vertical sidewalls and with a top surface having an area determined by a first dimension along a first axis and a second dimension along a second axis, said MTJ element has stack of layers comprised of a seed layer, AFM layer, pinned layer, tunnel barrier, free layer, hard mask spacer layer, and hard mask layer formed in order from bottom to top, comprising:
    (a) forming an unpatterned MTJ stack of layers on a substrate;
    (b) patterning a first photoresist layer on the hard mask layer to form a first parallel line pattern wherein each line has a width that is the first dimension along the first axis;
    (c) transferring said first parallel line pattern through the hard mask layer with a first etch step to form parallel hard mask lines on the hard mask spacer layer;
    (d) patterning a second photoresist layer on the parallel hard mask lines and hard mask spacer layer to form a second parallel line pattern wherein each line intersects the parallel hard mask lines and has a width that is the second dimension along the second axis, said second photoresist layer contacts a top surface of the parallel hard mask lines;
    (e) transferring said second parallel line pattern through the hard mask layer with a second etch step to form a post pattern in the hard mask layer wherein each post has an area determined by the first dimension and second dimension; and
    (f) performing a third etch step to transfer the hard mask post pattern through the hard mask spacer and remaining unpatterned layers in the MTJ stack of layers to form a plurality of MTJ elements, said first and second dimensions are formed simultaneously in the MTJ stack of layers below the hard mask layer, and said hard mask layer remains as an uppermost layer in the MTJ stack.

2. The method of claim 1 wherein the first dimension and second dimension are critical dimensions that are about 100 nm or less and the MTJ element is formed in a STT-MRAM device.

3. The method of claim 1 wherein the hard mask layer has a thickness of less than about 500 Angstroms and is comprised of Ta.

4. The method of claim 1 wherein the hard mask spacer layer has a thickness of about 200 to 800 Angstroms and is comprised of Cu or MnPt to provide a high etch selectivity during the first and second etch steps.

5. The method of claim 1 wherein the first dimension is greater than the second dimension and the first axis is an easy-axis of the MTJ element.

6. A method of fabricating a MTJ element with a top surface having an area determined by a first dimension along a first axis and a second dimension along a second axis, said MTJ element has stack of layers comprised of a seed layer, AFM layer, pinned layer, tunnel barrier, free layer, hard mask spacer layer, and hard mask layer formed in order from bottom to top, comprising:
    (a) forming an unpatterned MTJ stack of layers on a substrate;
    (b) patterning a first photoresist layer on the hard mask layer to form a first parallel line pattern wherein each line has a width that is the first dimension along the first axis;
    (c) transferring said first parallel line pattern through the hard mask layer with a first etch step to form parallel hard mask lines on the hard mask spacer layer;
    (d) patterning a second photoresist layer on the parallel hard mask lines and hard mask spacer layer to form a second parallel line pattern wherein each line intersects the parallel hard mask lines and has a width that is the second dimension along the second axis, said second photoresist layer contacts a top surface of the parallel hard mask lines;
    (e) transferring said second parallel line pattern through the hard mask layer with a second etch step to form a post pattern in the hard mask layer wherein each post has an area determined by the first dimension and second dimension; and
    (f) performing a third etch step to transfer the hard mask post pattern through the unpatterned hard mask spacer layer and at least a portion of the unpatterned free layer to form a plurality of MTJ elements, said first and second dimensions are formed simultaneously in the hard mask spacer and at least a portion of the free layer, said hard mask layer remains as an uppermost layer in the MTJ stack.

7. The method of claim 6 wherein the first dimension and second dimension are critical dimensions that are about 100 nm or less and the MTJ element is formed in a STT-MRAM device.

8. The method of claim 6 wherein the third etch step stops on the tunnel barrier layer.

9. The method of claim 6 wherein the third etch step stops in the free layer to form an upper section of the free layer having a post shape.

10. The method of claim 9 further comprised of oxidizing said lower section of the free layer to form an insulation layer between said MTJ element and adjacent MTJ elements in the plurality of MTJ elements.

11. The method of claim 6 wherein the hard mask layer is comprised of Ta and has a thickness less than about 500 Angstroms, and the hard mask spacer layer is made of Cu or MnPt to provide a high etch selectivity during the first and second etch steps.

12. A method of fabricating a MTJ element with a top surface having an area determined by a first dimension along a first axis and a second dimension along a second axis, said MTJ element has a stack of layers and is comprised of a seed layer, AFM layer, pinned layer, tunnel barrier, free layer, hard mask spacer layer, and hard mask layer formed in order from bottom to top, comprising:

(a) forming an unpatterned MTJ stack of layers with a first thickness on a substrate;

(b) patterning a first photoresist layer on the hard mask layer to form a first parallel line pattern wherein each line has a width that is the first dimension along the first axis;

(c) transferring said first parallel line pattern through the unpatterned MTJ stack of layers with a first etch step to form a parallel line pattern wherein each line has two sidewalls;

(d) forming a planar insulation layer on the substrate and adjacent to the two sidewalls of each line and with a thickness that is equal to or greater than said first thickness;

(e) patterning a second photoresist layer on the insulation layer and above the parallel line pattern to form a second parallel line pattern wherein each second photoresist line has a width that is the second dimension along the second axis and contacts a top surface of the parallel line pattern; and (f) transferring said second parallel line pattern through the MTJ stack of layers with a second etch step to form a post pattern comprised of a plurality of posts wherein each post has an area determined by the first dimension and second dimension, said hard mask layer remains as an uppermost layer in the MTJ stack.

13. The method of claim 12 wherein the first dimension and second dimension are critical dimensions that are about 100 nm or less and the MTJ element is formed in a STT-MRAM device.

14. The method of claim 12 wherein the planar insulation layer is formed by first depositing an insulation material on the substrate and then planarizing with a chemical mechanical polish (CMP) step.

15. The method of claim 12 wherein the first dimension is greater than the second dimension and the first axis is an easy-axis of the MTJ element.

16. The method of claim 12 wherein the hard mask layer is made of Ta and the hard mask spacer layer is comprised of Cu or MnPt.

17. A method of fabricating a MTJ element with a top surface having an area determined by a first dimension along a first axis and a second dimension along a second axis, said MTJ element has a stack of layers and is comprised of a seed layer, AFM layer, pinned layer, tunnel barrier, free layer, hard mask spacer layer, and hard mask layer formed in order from bottom to top, comprising:

(a) forming an unpatterned MTJ stack of layers with a first thickness on a substrate;

(b) patterning a first photoresist layer on the hard mask layer to form a first parallel line pattern wherein each line has a width that is the first dimension along the first axis;

(c) transferring said first parallel line pattern through the hard mask layer, unpatterned hard mask spacer layer, and at least an upper portion of the unpatterned free layer with a first etch step to form a parallel line pattern wherein each line has two sidewalls;

(d) forming a planar insulation layer adjacent to the two sidewalls of each line and with a thickness that is equal to or greater than said first thickness;

(e) patterning a second photoresist layer on the insulation layer and above the parallel line pattern to form a second parallel line pattern wherein each second photoresist line has a width that is the second dimension along the second axis and contacts a top surface of the parallel line pattern; and (f) transferring said second parallel line pattern through the hard mask layer, hard mask spacer layer, and at least an upper portion of the free layer with a second etch step to form a post pattern comprised of a plurality of posts wherein each post has an area determined by the first dimension and second dimension, said hard mask layer remains as an uppermost layer in the MTJ stack.

18. The method of claim 17 wherein one or both of the first etch step and the second etch step stops on the tunnel barrier layer.

19. The method of claim 17 wherein one or both of the first etch step and second etch step stops in the free layer to form an upper section of the free layer having sidewalls.

20. The method of claim 19 further comprised of oxidizing said lower section of the free layer to form an insulation layer between said MTJ element and adjacent MTJ elements in the plurality of MTJ elements.

21. The method of claim 17 wherein the first dimension is unequal to the second dimension and the MTJ element has an easy-axis that corresponds to one of the first axis or second axis which has a greater dimension, and said MTJ has a hard axis that corresponds to the one of the first axis or second axis that has the smaller dimension.

22. The method of claim 17 wherein the hard mask layer is comprised of Ta and the hard mask spacer layer is comprised of Cu or MnPt.

23. The method of claim 4 wherein the hard mask is made of Ta, the first and second etch steps comprise $CF_4$ or a fluorocarbon gas, and the third etch step comprises $CH_3OH$, $C_2H_5OH$, or $CO/NH_3$.

24. The method of claim 11 wherein the first and second etch steps comprise $CF_4$ or a fluorocarbon gas and the third etch step comprises $CH_3OH$, $C_2H_5OH$, or $CO/NH_3$.

* * * * *